United States Patent
Kim et al.

(10) Patent No.: US 8,436,462 B2
(45) Date of Patent: May 7, 2013

(54) SEMICONDUCTOR HOUSING PACKAGE, SEMICONDUCTOR PACKAGE STRUCTURE INCLUDING THE SEMICONDUCTOR HOUSING PACKAGE, AND PROCESSOR-BASED SYSTEM INCLUDING THE SEMICONDUCTOR PACKAGE STRUCTURE

(75) Inventors: Dong-Han Kim, Osan-si (KR); Sung-Woo Park, Anyang-si (KR); Jin-Woo Park, Seoul (KR); So-Young Lim, Hwaseong-si (KR); Jung-Hwan Kim, Bucheon-si (KR); Kwang-Jin Bae, Suwon-si (KR); Pa-Lan Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 47 days.

(21) Appl. No.: 13/072,012

(22) Filed: Mar. 25, 2011

(65) Prior Publication Data

US 2011/0233755 A1 Sep. 29, 2011

(30) Foreign Application Priority Data

Mar. 26, 2010 (KR) .................. 10-2010-0027467

(51) Int. Cl.
*H01L 23/48* (2006.01)
*H01L 23/34* (2006.01)

(52) U.S. Cl.
USPC .......... 257/693; 257/685; 257/686; 257/723; 257/777; 257/E23.092; 257/E23.116

(58) Field of Classification Search .................. 257/693, 257/E23.011, 685, 686, 723, 777, E23.092, 257/E23.116
See application file for complete search history.

(56) References Cited

U.S. PATENT DOCUMENTS

2011/0037163 A1* 2/2011 Lachner et al. ............... 257/693

FOREIGN PATENT DOCUMENTS

| JP | 2004335603 A | 11/2004 |
|---|---|---|
| JP | 2008016519 A | 1/2008 |
| KR | 20090012933 A | 2/2009 |

* cited by examiner

*Primary Examiner* — Jasmine Clark
(74) *Attorney, Agent, or Firm* — Harness, Dickey & Pierce P.L.C.

(57) ABSTRACT

A semiconductor housing package may be provided. The semiconductor housing package may include a mold layer, a housing chip, a redistribution structure, and a housing node. The mold layer may surround and partially expose the housing chip. The redistribution structure may be electrically connected to the housing chip and may be disposed on the mold layer. The housing node may be in contact with the redistribution structures. The semiconductor housing package may be disposed on a semiconductor base package and may constitute a semiconductor package structure along with the semiconductor base package. The semiconductor package structure may be disposed on a processor-based system.

14 Claims, 21 Drawing Sheets

SEMICONDUCTOR HOUSING PACKAGE, SEMICONDUCTOR PACKAGE STRUCTURE INCLUDING THE SEMICONDUCTOR HOUSING PACKAGE, AND PROCESSOR-BASED SYSTEM INCLUDING THE SEMICONDUCTOR PACKAGE STRUCTURE

CROSS-REFERENCE TO RELATED APPLICATION

This application claims priority under 35 U.S.C. §119 to Korean Patent Application No. 10-2010-0027467 filed on Mar. 26, 2010 in the Korean Intellectual Property Office (KIPO), the entire contents of which is herein incorporated by reference.

BACKGROUND

1. Field

Example embodiments relate to a semiconductor housing package, a semiconductor package structure including the semiconductor housing package, and a processor-based system including the semiconductor package structure.

2. Description of Related Art

In recent years, a semiconductor package structure has been fabricated using a plurality of semiconductor packages to increase a high speed and a multi-function of an electronic product. Also, the semiconductor packages may be sequentially stacked in the semiconductor package structure to increase an integration density of the semiconductor package structure. In this case, the semiconductor packages may have printed circuit boards (PCBs), respectively. The PCBs may electrically connect the semiconductor package structure to the electronic product. Thus, the electronic product may obtain electrical properties of the semiconductor package structure.

However, the PCBs may limit the integration density of the semiconductor package structure. This is because each of the PCBs is disposed in a selected space of the semiconductor package structure, thereby preventing the selected space from being shared by the semiconductor packages. Thus, the PCBs may spatially limit the integration density of the semiconductor package structure. Also, since each of the PCBs is used to correspond to each of the semiconductor packages, the PCBs may increase the fabrication cost of the semiconductor package structure.

The semiconductor package structure may be disposed on the electronic product including a processor-based system. The processor-based system may have a complicated structure therein or a high fabrication cost thereof due to the semiconductor package structure. The above-described conventional problems may be solved using structures according to example embodiments.

SUMMARY

Example embodiments may provide a semiconductor housing package suitable for packaging a semiconductor chip without using a printed circuit board (PCB).

Also, example embodiments may provide a semiconductor package structure suitable for reducing the number of times a PCB is used and packaging semiconductor chips that are sequentially stacked.

Furthermore, example embodiments may provide a processor-based system suitable for simplifying an internal structure and reducing a fabrication cost.

To embody these ends, example embodiments may provide a semiconductor housing package including a housing chip in a mold layer and a redistribution structure on the mold layer.

Example embodiments may provide a semiconductor package structure including a semiconductor housing package not using a PCB, and a semiconductor base package using the PCB.

Example embodiments may provide a processor-based system including a semiconductor package structure suitable for properly controlling the number of times a PCB is used.

In accordance with example embodiments, a semiconductor housing package may include a mold layer, a housing chip in the mold layer, redistribution structures extending from the housing chip and along a bottom surface of the mold layer, and at least one housing node contacting the redistribution structures and protruding from the redistribution structures. In example embodiments, the housing chip may be exposed by the mold layer and the redistribution structures may be electrically connected to the housing chip.

In accordance with example embodiments, a semiconductor housing package may include a mold layer, a housing chip, redistribution structures, and a housing node. The housing chip may be disposed in the mold layer and may be exposed by a selected surface of the mold layer. The redistribution structures may extend from the housing chip toward the selected surface of the mold layer. The redistribution structures may be electrically connected to the housing chip. The housing node may contact the redistribution structures and may protrude from the redistribution structures.

The selected surface of the mold layer may be flat or concave in the vicinity of the housing chip.

The semiconductor housing package may further include an auxiliary housing chip disposed at least one under the housing chip. The auxiliary housing chip may be electrically connected to the redistribution structures through one of a connection ball and a lead line. The connection ball may be interposed between the auxiliary housing chip and the redistribution structures and contact the auxiliary housing chip and the redistribution structures. The lead line may be disposed adjacent to the auxiliary housing chip and contact the auxiliary housing chip and the redistribution structures.

The housing chip may include first and second housing chips at least. The first housing chip may be electrically connected to the second housing chip and the redistribution structures through a through-silicon via (TSV) and a bump. The TSV may penetrate the first housing chip and contacts the bump and the redistribution structures. The bump may be disposed on the TSV and electrically connected to the second housing chip.

The housing chip may include first and second housing chips at least. The first housing chip may be electrically connected to the second housing chip and the redistribution structures through a TSV and a lead line. The TSV may penetrate the first housing chip and contact the lead line and the redistribution structures. The lead line may extend from the TSV toward the second housing chip and be electrically connected to the second housing chip.

In accordance with example embodiments, a semiconductor package structure may include a semiconductor housing package. The semiconductor housing package may include a mold layer, a housing chip, redistribution structures, and housing nodes. The housing chip may be surrounded by the mold layer and may be exposed by the mold layer. Redistribution structures may extend from the mold layer toward the housing chip and may be electrically connected to the housing chip. Housing nodes may protrude from the redistribution structures, respectively.

The semiconductor package structure may further include a semiconductor base package. The semiconductor base package may include a circuit substrate and a base chip. The circuit substrate may be electrically connected to the housing nodes. The base chip may be interposed between the housing nodes on the circuit substrate and electrically connected to the circuit substrate.

The semiconductor base package may include first landing pads and second landing pads disposed on the circuit substrate. The first landing pads and the second landing pads may be electrically connected to the circuit substrate. The first landing pads may be disposed on an edge of the circuit substrate. The second landing pads may be interposed between the edge and a central region of the circuit substrate.

When the mold layer has a flat shape in the vicinity of the housing chip, the base chip may be defined by a thickness of the housing nodes in a direction of a thickness of the housing chip and disposed on the circuit substrate. A thickness of the base chip may be smaller than a thickness of each of the housing nodes in the direction of the thickness of the housing chip. The first landing pads may be in contact with the housing nodes. The second landing pads may be electrically connected to the base chip through connection balls.

When the mold layer has a concave shape in the vicinity of the housing chip, the housing nodes may be disposed on ends of side portions of a concave shape of the mold layer. A thickness of each of the housing nodes may be substantially equal to or different from a thickness of the base chip in a direction of a thickness of the housing chip. The base chip may include first and second base chips at least, which are sequentially stacked. The first and second base chips may be defined by a length of the side portions of the concave shape of the mold layer and a thickness of the housing nodes in the direction of the thickness of the housing chip and interposed between the housing nodes. The first landing pads may be in contact with the housing nodes. The second landing pads may be electrically connected to the first base chip through connection balls. The second base chip may be electrically connected to the first landing pads through lead lines.

When the mold layer has a concave shape in the vicinity of the housing chip, the housing nodes may be disposed on ends of side portions of a concave shape of the mold layer. A thickness of each of the housing nodes may be substantially equal to or different from a thickness of each of the redistribution structures in a direction of a thickness of the redistribution structures. The base chip may include first and second base chips at least, which are sequentially stacked.

The first and second base chips may be defined by a length of the side portions of the concave shape of the mold layer and a thickness of the housing nodes in the direction of the thickness of the housing chip and interposed between the housing nodes. The first landing pads may be in contact with the housing nodes. The second landing pads may be electrically connected to the first base chip through connection balls. The second base chip may be electrically connected to the first landing pads through lead lines.

The semiconductor package structure may further include an auxiliary housing chip disposed at least one under the housing chip. The auxiliary housing chip may be electrically connected to the redistribution structures through one selected group of connection balls and lead lines. The connection balls may be interposed between the auxiliary housing chip and the redistribution structures and contact the auxiliary housing chip and the redistribution structures. The lead lines may be disposed adjacent to the auxiliary housing chip and contact the auxiliary housing chip and the redistribution structures.

The housing chip may include first and second housing chips at least. The first housing chip may be electrically connected to the second housing chip and the redistribution structures through TSVs and bumps. The TSVs may penetrate the first housing chip and contact the bumps and the redistribution structures. The bumps may be disposed on the TSVs and electrically connected to the second housing chip.

The housing chip may include first and second housing chips at least. The first housing chip may be electrically connected to the second housing chip and the redistribution structures through TSVs and lead lines. The TSVs may penetrate the first housing chip and contact the lead lines and the redistribution structures. The lead lines may extend from the TSVs toward the second housing chip and be electrically connected to the second housing chip.

The redistribution structures may be disposed inside the mold layer or on a top surface of the mold layer.

The housing chip may have a horizontal surface and a sidewall perpendicular to the horizontal surface to define a chip body in the vicinity of the redistribution structures. Also, the housing chip may have one shape selected from the group consisting of a corner configured to bring a horizontal surface into direct contact with a sidewall perpendicular to the horizontal surface, an inclined surface interposed between the horizontal surface and the sidewall, a stepped surface interposed between the horizontal surface and the sidewall, and a concave disposed in the horizontal surface.

The molding layer may contact at least the corner and the sidewall in the chip body or contact at least the horizontal surface, the sidewall, and the one selected shape.

In accordance with example embodiments, a processor-based system may include a system board, a first module unit, and a second module unit. The system board may have at least one bus line. The first module unit may be disposed on the system board and may be electrically connected to the at least one bus line. The second module unit may be disposed on the system board and electrically connected to the at least one bus line. At least one of the first and second module units may have a semiconductor package structure.

The semiconductor package structure may include a semiconductor housing package and a semiconductor base package. The semiconductor housing package may include a mold layer, a housing chip, redistribution structures, and housing nodes. The housing chip may be surrounded and exposed by the mold layer. The redistribution structures may extend from the mold layer toward the housing chip and be electrically connected to the housing chip. The housing nodes may protrude from the redistribution structures, respectively.

The semiconductor base package may include a circuit substrate and a base chip. The circuit substrate may be electrically connected to the housing nodes. The base chip may be interposed between the housing nodes on the circuit substrate and electrically connected to the circuit substrate.

The first module unit may include a central processing unit (CPU), a floppy disk drive (FDD), and a compact disk (CD) read-only memory (ROM) drive, and the second module unit may include a first input/output (I/O) device, a second I/O device, a ROM, and a random access memory (RAM).

The mold layer may have one of a flat shape and a concave shape in the vicinity of the housing chip.

The processor-based system may further include an auxiliary housing chip disposed at least one under the housing chip. The auxiliary housing chip may be electrically connected to the redistribution structures through one selected group of connection balls and lead lines. The connection balls may be interposed between the auxiliary housing chip and the redistribution structures and contact the auxiliary housing chip and the redistribution structures. The lead lines may be disposed adjacent to the auxiliary housing chip and contact the auxiliary housing chip and the redistribution structures.

The housing chip may include first and second housing chips at least. The first housing chip may be electrically connected to the second housing chip and the redistribution structures through TSVs and bumps. The TSVs may penetrate the first housing chip and contact the bumps and the redistribution structures. The bumps may be disposed on the TSVs and electrically connected to the second housing chip.

BRIEF DESCRIPTION OF THE DRAWINGS

The foregoing and other features and advantages of example embodiments will be apparent from the more particular description of example embodiments, as illustrated in the accompanying drawings in which like reference characters refer to the same parts throughout the different views. The drawings are not necessarily to scale, emphasis instead being placed upon illustrating the principles of example embodiments. In the drawings.

DETAILED DESCRIPTION OF THE EMBODIMENTS

Figure 1:
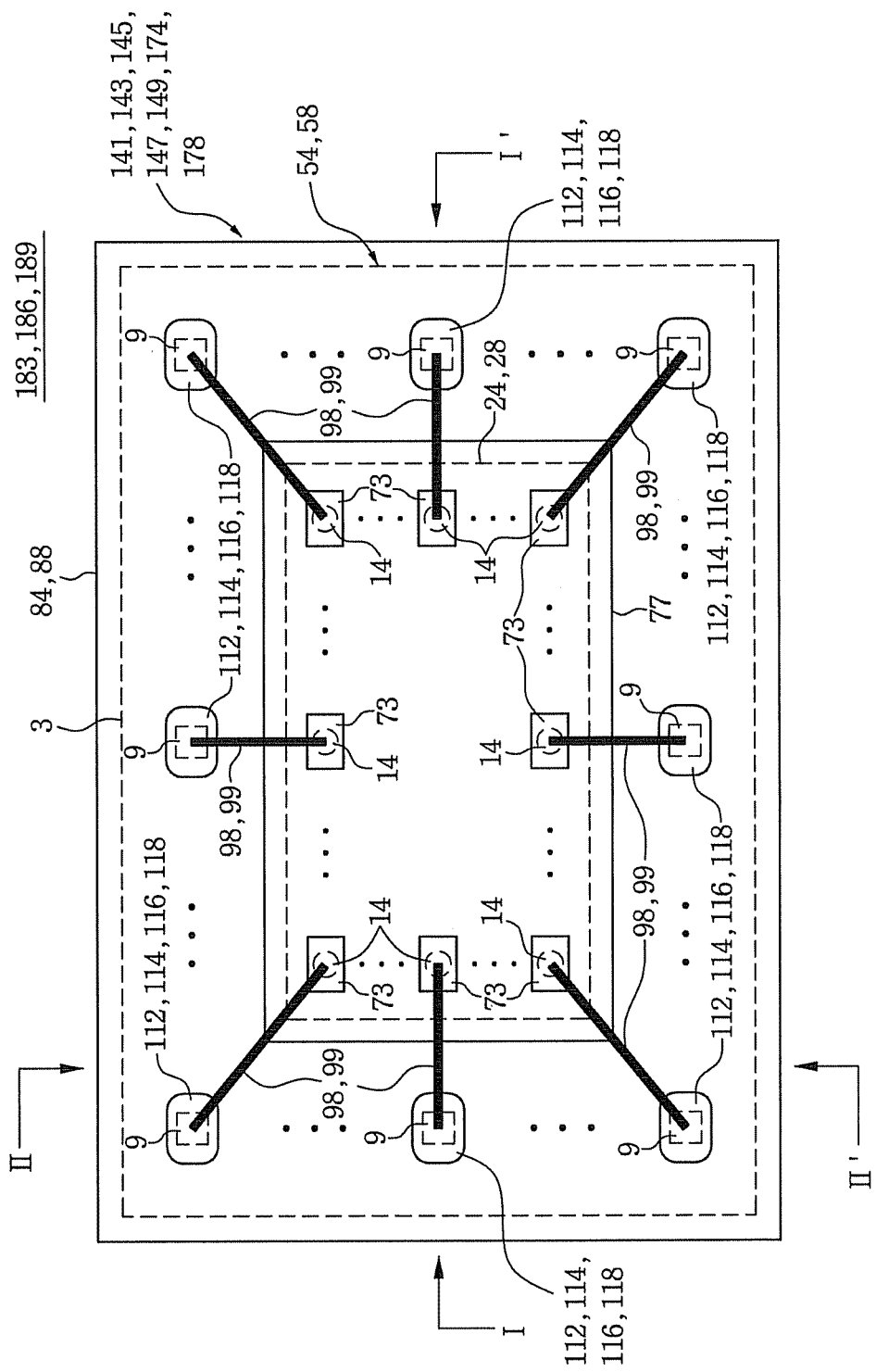
FIG. 1 is a plan view of semiconductor package structures according to example embodiments.

Example embodiments will now be described more fully with reference to the accompanying drawings in which example embodiments are shown. Example embodiments may, however, be embodied in different forms and should not be construed as limited to the embodiments set forth herein. Rather, these embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers—and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all team (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a semiconductor package structure according to example embodiments of the inventive concepts will be described in more detail with reference to FIGS. 1 and 2.

FIG. 1 is a plan view of semiconductor package structures according to example embodiments.

Referring to FIG. 1, a semiconductor package structure 183, 186, or 189 may include a semiconductor housing package 141, 143, 145, 147, 149, 174, or 178. The semiconductor housing package 141, 143, 145, 147, 149, 174, or 178 may be indicated by solid lines in FIG. 1. In this case, the semiconductor housing package 141, 143, 145, 147, 149, 174, or 178 may include a housing chip 77 and a mold layer 84 or 88.

The housing chip 77 may include connection pads 73. The connection pads 73 may be disposed in an edge and/or another region of the housing chip 77. The housing chip 77 may be disposed in a central region of the mold layer 84 or 88. The mold layer 84 or 88 may be disposed adjacent to the housing chip 77 to surround the housing chip 77. The mold layer 84 or 88 may be a substitute for a printed circuit board (PCB).

The semiconductor housing package 141, 143, 145, 147, 149, 174, or 178 may further include redistribution structures 98 or 99 and housing nodes 112, 114, 116, or 118. The redistribution structures 98 or 99 may extend from the connection pads 73 of the housing chip 77 toward the housing nodes 112, 114, 116, or 118 disposed in the mold layer 84 or 88. The redistribution structures 98 or 99 may contact the connection pads 73 and the housing nodes 112, 114, 116, or 118. The redistribution structures 98 or 99 may have a different shape than in FIG. 1.

The housing nodes 112, 114, 116, or 118 may be spaced apart from the housing chip 77 and disposed in the mold layer 84 or 88. The housing nodes 112, 114, 116, or 118 may or may not correspond one-to-one to the connection pads 73 through the redistribution structures 98 or 99. Thus, the housing nodes 112, 114, 116, or 118 may be provided in equal number to or a different number from the connection pads 73. Meanwhile, the semiconductor package structure 183, 186, or 189 may include a semiconductor base package 54 or 58.

The semiconductor base package 54 or 58 may be indicated by a dotted line in FIG. 1. The semiconductor base package 54 or 58 may include a circuit substrate 3 and a base chip 24 or 24 and 28. The circuit substrate 3 may be aligned with and may overlap the mold layer 84 or 88 of the semiconductor housing package 141, 143, 145, 147, 149, 174, or 178. The circuit substrate 3 may be a PCB. The circuit substrate 3 may have substrate nodes 9. The substrate nodes 9 may be disposed in an edge of the circuit substrate 3.

The substrate nodes 9 may be disposed in the edge and/or another region of the circuit substrate 3. The substrate nodes 9 may be aligned with and overlap the housing nodes 112, 114, 116, or 118 of the semiconductor housing package 141, 143, 145, 147, 149, 174, or 178. However, example embodiments are not limited thereto as the substrate nodes 9 may not be aligned with the housing nodes 112, 114, 116, or 118. The substrate nodes 9 may be provided in equal number to or a different number from the housing nodes 112, 114, 116, or 118. The base chip 24 may be disposed in a central region of the circuit substrate 3.

The base chip 24 may be aligned with and may overlap the housing chip 77 of the semiconductor housing package 141, 143, 145, 147, 149, 174, or 178. However, example embodiments are not limited thereto as the base chip 24 may not overlap the housing chip 77 of the semiconductor housing package 141, 143, 145, 147, 149, 174, or 178. The base chip 24 may be electrically connected to the circuit substrate 3 through connection balls 14. The connection balls 14 may be aligned with and may overlap the connection pads 73 of the housing chip 77. However, example embodiments are not limited thereto as the connection balls 14 may not overlap the connection pads 73 of the housing chip 77.

Figure 2:
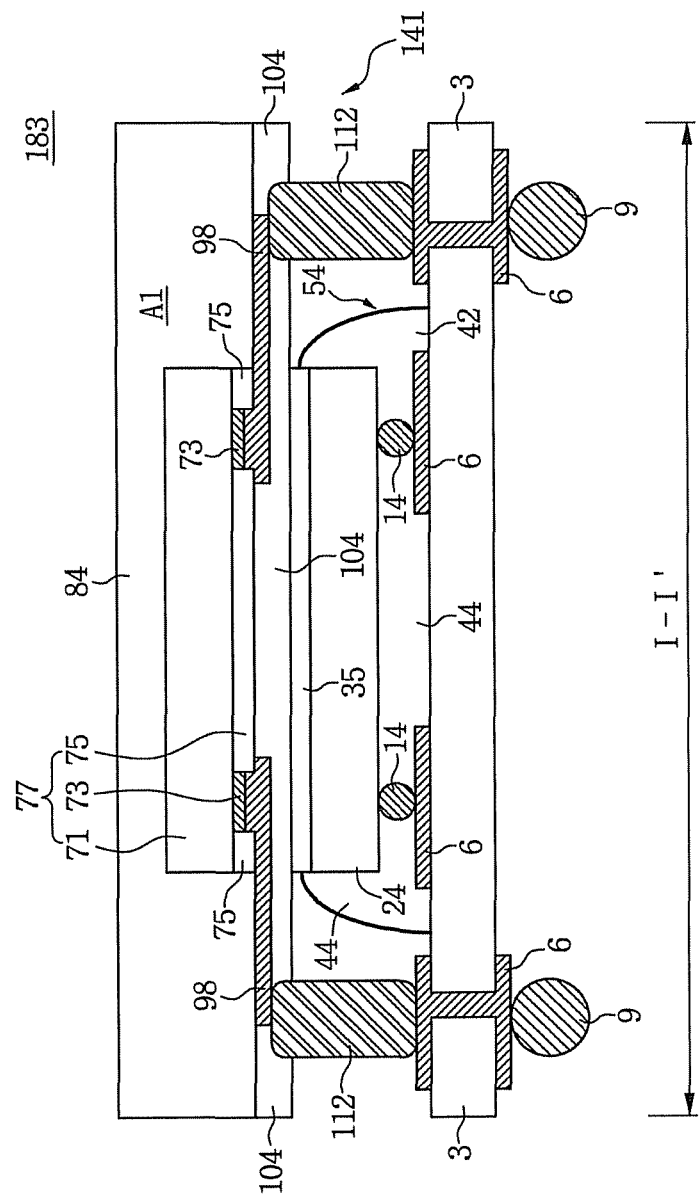
FIG. 2 is a cross-sectional view taken along line I-I' of FIG. 1.

FIG. 2 is a cross-sectional view taken along line I-I' of FIG. 1, showing one of the semiconductor package structures of FIG. 1.

Referring to FIG. 2, a semiconductor package structure 183 may include a semiconductor housing package 141. The semiconductor housing package 141 may include a mold layer 84 and a housing chip 77. The mold layer 84 may surround the housing chip 77 to partially expose the housing chip 77. The mold layer 84 may have a flat shape in the vicinity of the housing chip 77. The mold layer 84 may include an epoxy molding compound (EMC).

The housing chip 77 may include a chip body 71, connection pads 73, and, an insulating layer 75. The chip body 71 may have a semiconductor circuit. The chip body 71 may be defined by horizontal planes substantially parallel to the insulating layer 75 and sidewalls perpendicular to the horizontal planes. The semiconductor circuit may singly refer to a logic circuit or logic and memory circuits. The connection pads 73 may be disposed on the chip body 71. The connection pads 73 may be electrically connected to the semiconductor circuit of the chip body 71.

The connection pads 73 may be exposed by the insulating layer 75 and the mold layer 84. The connection pads 73 may include a conductive material. The insulating layer 75 may surround the connection pads 73. The thickness of the insulating layer 75 may be equal to or different from the thickness of the connection pads 73 in a direction of a thickness of the housing chip 77. The insulating layer 75 may include an insulating material. The housing chip 77 and the mold layer 84 may constitute a mold structure A1. The semiconductor housing package 141 may further include redistribution structures 98, a protection layer 104, and housing nodes 112.

The redistribution structures 98 may be in contact with the connection pads 73 through the protection layer 104. The redistribution structures 98 may extend from the housing chip 77 toward the mold layer 84. The redistribution structures 98 may include a conductive material. The protection layer 104 may cover the housing chip 77, the mold layer 84, and the redistribution structures 98. In example embodiments, the protection layer 104 may partially expose the redistribution structures 98. The housing nodes 112 may be in contact with the redistribution structures 98 through the protection layer 104.

The housing nodes 112 may protrude from the protection layer 104. The housing nodes 112 may include a conductive material. In example embodiments, the semiconductor package structure 183 may further include a semiconductor base package 54. The semiconductor base package 54 may include a circuit substrate 3. The circuit substrate 3 may include conductive patterns. The conductive patterns may constitute a desired circuit in the circuit substrate 3.

The circuit substrate 3 may include a PCB. The circuit substrate 3 may further include landing pads 6 and substrate nodes 9. The landing pads 6 may be electrically connected to the conductive patterns of the circuit substrate 3. The landing pads 6 may include first and second landing pads. The first landing pads 6 may be disposed in an edge of the circuit substrate 3. The first landing pads 6 may be in contact with the housing nodes 112 of the semiconductor housing package 141.

The second landing pads 6 may be disposed between the edge and a central region of the circuit substrate 3. The first and second landing pads 6 may include a conductive material. The substrate nodes 9 may be disposed under the circuit substrate 3 and contact the first landing pads 6. The semiconductor base package 54 may further include connection balls 14, a base chip 24, an adhesive 35, and a base filler 44. The connection balls 14 may be in contact with the second landing pads 6. The connection balls 14 may include a conductive material.

The base chip 24 may include a semiconductor circuit. The semiconductor circuit may refer to a logic circuit singly or logic and memory circuits. The base chip 24 may be disposed on the connection balls 14. The base chip 24 may be electrically connected to the connection balls 14 through the semiconductor circuit. The base chip 24 may be defined by a thickness of a housing node 112 of the semiconductor housing package 141 in the direction of the thickness of the housing chip 77 and interposed between the housing nodes 112.

In example embodiments, a thickness of the base chip 24 may be smaller than the thickness of each of the housing nodes 112 in the direction of the thickness of the housing chip 77. The adhesive 35 may be disposed on the base chip 24. The adhesive 35 may be disposed on a surface of the base chip 24 disposed opposite the connection balls 14. The adhesive 35 may be used to adhere the base chip 24 to the protection layer 104 of the semiconductor housing package 141. The adhesive 35 may include an insulating material.

The base filler 44 may be disposed on the circuit substrate 3 and may at least partially cover the base chip 24. The base filler 44 may expose the first landing pads 6 and fill a space between the circuit substrate 3 and the base chip 24. The base filler 44 may be used to adhere the base chip 24 to the circuit substrate 3. The base filler 44 may include an insulating material.

Figure 3:
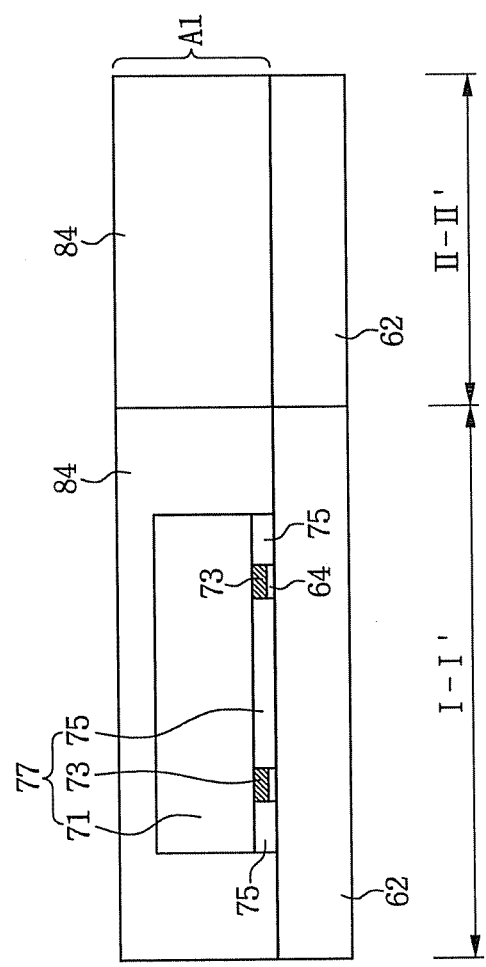
FIGS. 3 through 5 are cross-sectional views taken along lines I-I' and II-II' of FIG. 1, illustrating a method of forming a semiconductor housing package of a semiconductor package structure according to example embodiments.
Figure 4:
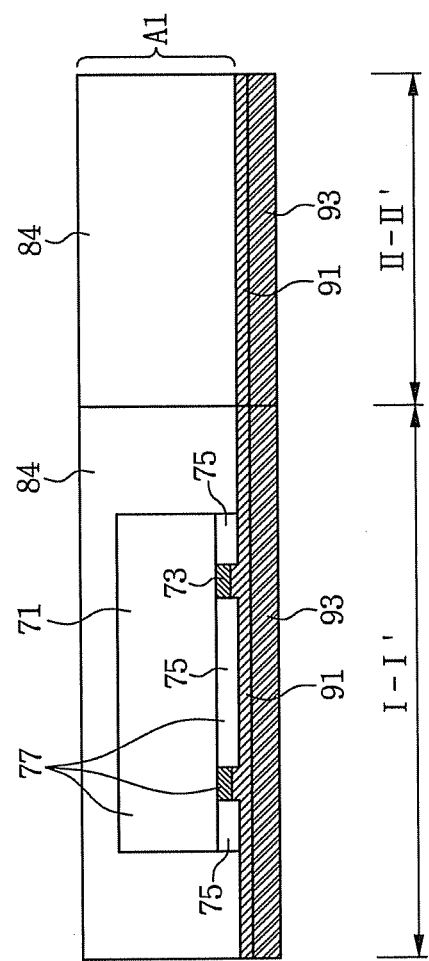
Figure 5:
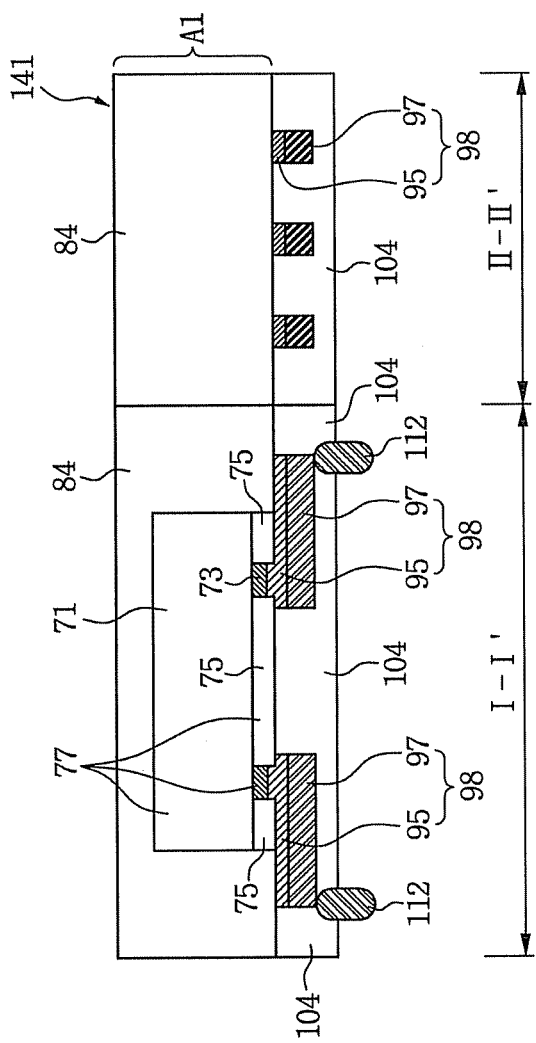

FIGS. 3 through 5 are cross-sectional views taken along lines I-I' and II-II' of FIG. 1, illustrating a method of forming a semiconductor housing package of a semiconductor package structure according to example embodiments. FIGS. 3 through 5 use like reference numerals for like members as shown in FIG. 2.

Referring to FIG. 3, a supporting plate 62 and a housing chip 77 may be prepared. The supporting plate 62 may include a flexible material or an inflexible material. The housing chip 77 may be disposed on the supporting plate 62. The housing chip 77 may include a chip body 71, connection pads 73, and an insulating layer 75. The chip body 71 may have a semiconductor circuit. The semiconductor circuit may include single crystalline silicon, an insulating material, a conductive material, and impurity ions.

The connection pads 73 may be electrically connected to the semiconductor circuit of the chip body 71. The connection pads 73 may include a conductive material. The insulating layer 75 may be disposed on the chip body 71 and may expose the connection pads 73. The insulating layer 75 may include at least one insulating material. In example embodiments, the insulating layer 75 may be disposed on the chip body 71 and may contact the supporting plate 62. The insulating layer 75 may have vacant spaces 64 between the supporting plate 62 and the connection pads 73.

The supporting plate 62, the connection pads 73, and the insulating layer 75 may define the vacant spaces 64. A mold layer 84 may be formed on the supporting plate 62 to surround the housing chip 77. The mold layer 84 may include an EMC. The mold layer 84 may constitute a mold structure A1 together with the housing chip 77. Alternatively, the supporting plate 62 may not be disposed on the housing chip 77 and the mold layer 84.

To do this, the housing chip 77 may also be mounted on the mold layer 84 disposed in a molding body (not shown). The molding body may define an outer surface of the mold layer 84 and form a mounting portion in a predetermined region of the outer surface of the mold layer 84. The mounting portion may extend from the outer surface of the mold layer 84 to an inside of the mold layer 84. The housing chip 77 may be located on the mounting portion of the mold layer 84.

The housing chip 77 may be disposed on the mounting portion of the mold layer 84 to expose the connection pads 73 and the insulating layer 75 through the mold layer 84. Heat may or may not be applied to the mold layer 84. In example embodiments, the mold layer 84 may surround and contact the housing chip 77 to continuously expose the connection pads 73 and the insulating layer 75 of the housing chip 77. Thus, the mold layer 84 may constitute the mold structure A1 together with the housing chip 77.

Referring to FIG. 4, according to example embodiments, the supporting plate 62 may be separated from the mold structure A1. Alternatively, when the supporting plate 62 is not disposed under the mold structure A1, the molding body may be separated from the mold layer 84. Subsequently, a first conductive layer 91 and a second conductive layer 93 may be sequentially formed on the mold structure A1. The first conductive layer 91 may be formed by performing a sputtering process on the mold structure A1.

The first conductive layer 91 may be disposed on the mold layer 84 and the insulating layer 75 and may contact the connection pads 73. The first conductive layer 91 may be used to appropriately facilitate formation of the second conductive layer 93 on the mold layer 84 and/or adhesion of the second conductive layer 93 to the mold layer 84. The first conductive layer 91 may include chromium (Cr). The second conductive layer 93 may be formed on the first conductive layer 91 using an electroplating process. The second conductive layer 93 may include aluminium (Al) or copper (Cu).

Referring to FIG. 5, according to example embodiments, photolithography and etching processes may be performed on the first and second conductive layers 91 and 93, thereby forming first and second conductive patterns 95 and 97. The first and second conductive patterns 95 and 97 may expose the insulating layer 75 and the mold layer 84. The first and second conductive patterns 95 and 97 may constitute redistribution structures 98. The redistribution structures 98 may extend from the housing chip 77 toward the mold layer 84. For example, the redistribution structures 98 may extend from a connection pad 73 of the housing chip 77 and across a lower surface of the mold layer 84.

The redistribution structures 98 may or may not partially expose the connection pads 73. A protection layer 104 may be formed on the insulating layer 75 and the mold layer 84 to cover the redistribution structures 98. The protection layer 104 may be formed using a sputtering process or a deposition process. The protection layer 104 may partially expose the redistribution structures 98 through openings. The protection layer 104 may include an insulating material.

Housing nodes 112 may be formed in the protection layer 104. The housing nodes 112 may be formed using a soldering process. The housing nodes 112 may be in contact with the redistribution structures 98 through the openings of the protection layer 104. The housing nodes 112 may protrude from the protection layer 104. The housing nodes 112 may include a conductive material. The housing nodes 112 may constitute a semiconductor housing package 141 together with the mold structure A1, the redistribution structures 98, and the protection layer 104.

Alternatively, the semiconductor housing package 141 may include the redistribution structures 98, the protection layer 104, and/or the housing nodes 112, which are printed using an inkjet process. The inkjet process may include printing a conductive ink and/or an insulating ink on the housing chip 77 and the mold layer 84 and heating the conductive ink and/or the insulating ink. In example embodiments, the conductive ink may be selectively printed on the housing chip 77 and the mold layer 84 to form the redistribution structures 98 and/or the housing nodes 112 of FIG. 5.

The insulating ink may be disposed on the housing chip 77, the mold layer 84, and the redistribution structures 98 to form the protection layer 104.

FIGS. 6 through 9 are cross-sectional views taken along lines I-I' and II-II' of FIG. 1, illustrating a method of forming a semiconductor housing package of a semiconductor package structure according to example embodiments. FIGS. 6 through 9 use like reference numerals for like members as shown in FIGS. 3 through 5.

Figure 6:
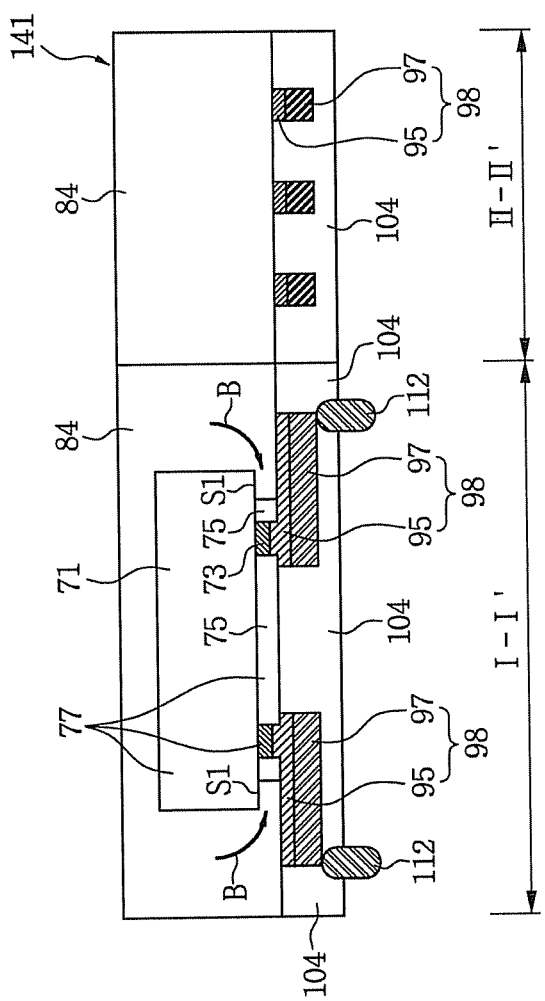
FIGS. 6 through 9 are cross-sectional views taken along lines I-I' and II-II' of FIG. 1, illustrating a method of forming a semiconductor housing package of a semiconductor package structure according to example embodiments.

Referring to FIG. 6 and FIG. 3, according to example embodiments, the supporting plate 62 and the housing chip 77 of FIG. 3 may be prepared. The housing chip 77 may be disposed on the supporting plate 62. An etching process may be performed on the housing chip 77. The etching process may be performed using a wet or dry etchant having a higher etch rate with respect to an insulating layer 75 than an etch rate with respect to the supporting plate 62, a chip body 71, and connection pads 73. The wet or dry etchant may partially etch the insulating layer 75.

The insulating layer 75 may be etched from sidewalls of the chip body 77 toward the connection pads 73. In example embodiments, the insulating layer 75 may be etched to surround the connection pads 73. Thus, grooves may be formed between the supporting plate 62 and the chip body 71. The grooves may have first surfaces S1 disposed on the chip body 71. The first surfaces S1 may be substantially parallel to an interface between the supporting plate 62 and the insulating layer 75. The first surface S1 may correspond to one of the horizontal surfaces of the chip body 71 of FIG. 2.

The first surfaces S1 may be at a right angle with the sidewalls of the chip body 71 of FIG. 2. Subsequently, the processes described with reference to FIGS. 3 through 5 may be performed on the housing chip 77, thereby constituting a semiconductor housing package 141. Alternatively, before the supporting plate 62 and the housing chip 77 of FIG. 3 are prepared, the housing chip 77 may be singly processed irrespective of the supporting plate 62 to form the insulating layer 75 in the same shape as in FIG. 6 on the chip body 71.

For example, before the housing chip 77 is disposed on the supporting plate 62, the insulating layer 75 may be selectively etched on the chip body 71. The insulating layer 75 may expose the first surfaces S1 from the chip body 71. Thereafter, the processes described with reference to FIGS. 3 through 5 may be performed on the housing chip 77, thereby forming the semiconductor housing package 141. In example embodiments, the mold layer 84 may fill the grooves defined by the first surfaces S1 of the chip body 71 in a direction B of motion of volume thereof.

Thus, the grooves defined by the first surfaces S1 of the chip body 71 may prevent separation of the mold layer 84 from the semiconductor housing package 141. The semiconductor housing package 141 may be disposed on the semiconductor base package 54 of FIG. 2.

Figure 7:
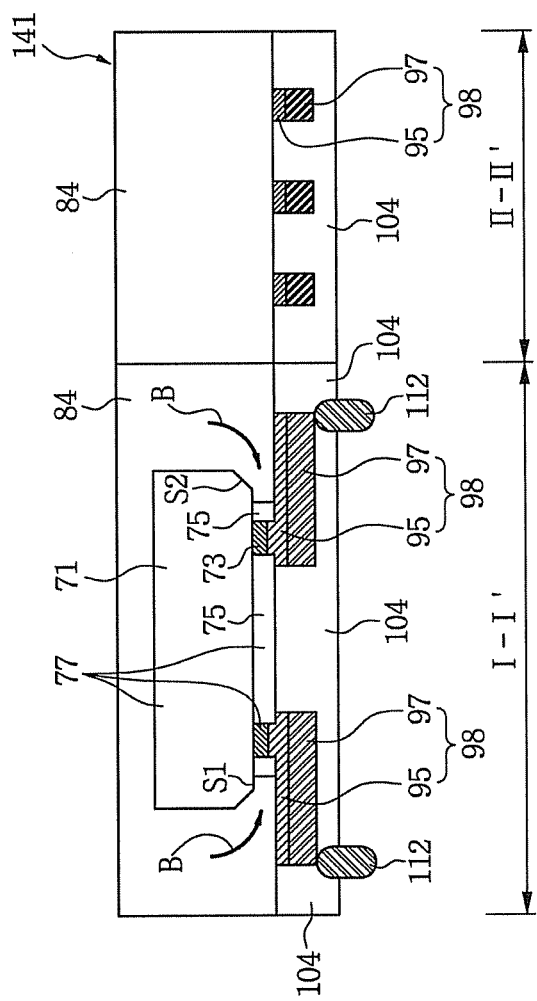

Referring to FIG. 7, according to example embodiments, the supporting plate 62 and the housing chip 77 of FIG. 3 may be prepared. The housing chip 77 may be disposed on the supporting plate 62. An etching process may be performed on the housing chip 77. The etching process may be performed using a wet or dry etchant having a higher etch rate with respect to a chip body 71 and an insulating layer 75 than an etch rate with respect to the supporting plate 62 and a connection pads 73. The wet or dry etchant may partially etch the chip body 71 and the insulating layer 75.

The wet or dry etchant may have a higher etch rate with respect to the insulating layer 75 than an etch rate with respect to the chip body 71. In example embodiments, the wet or dry etchant may etch the insulating layer 75 to form the grooves of FIG. 6 between the supporting plate 62 and the chip body 71. Furthermore, the wet or dry etchant may etch the sidewalls and first surfaces S1 of the chip body 71 of FIG. 6 to 3-dimensionally etch the chip body 71. The chip body 71 may have second surfaces S2 between the sidewalls and first surfaces S1 of FIG. 6. The second surfaces S2 may be inclined to the first surfaces S1 and the sidewalls.

Subsequently, the processes described with reference to FIGS. 3 through 5 may be performed on the housing chip 77 to form a semiconductor housing package 141. Alternatively, before the supporting plate 62 and the housing chip 77 of FIG. 3 are prepared, the housing chip 77 may be singly processed irrespective of the supporting plate 62 to form the insulating layer 75 in the same shape as in FIG. 7 on the chip body 71. To do this, before the housing chip 77 is disposed on the supporting plate 62, the chip body 71 and the insulating layer 75 may be etched as shown in FIG. 7.

The chip body 71 may have the second surfaces S2 between the first surfaces S1 and sidewalls of FIG. 6. Afterwards, the processes described with reference to FIGS. 3 through 5 may be performed on the housing chip 77 to form the semiconductor housing package 141. In example embodiments, the mold layer 84 may fill grooves defined by the first and second surfaces S1 and S2 of the chip body 71 in a direction B of motion of the volume thereof. As a result, the grooves defined by the first and second surfaces S1 and S2 of the chip body 71 may prevent separation of the mold layer 84 from the semiconductor housing package 141.

The semiconductor housing package 141 may be disposed on the semiconductor base package 54 of FIG. 2.

Figure 8:
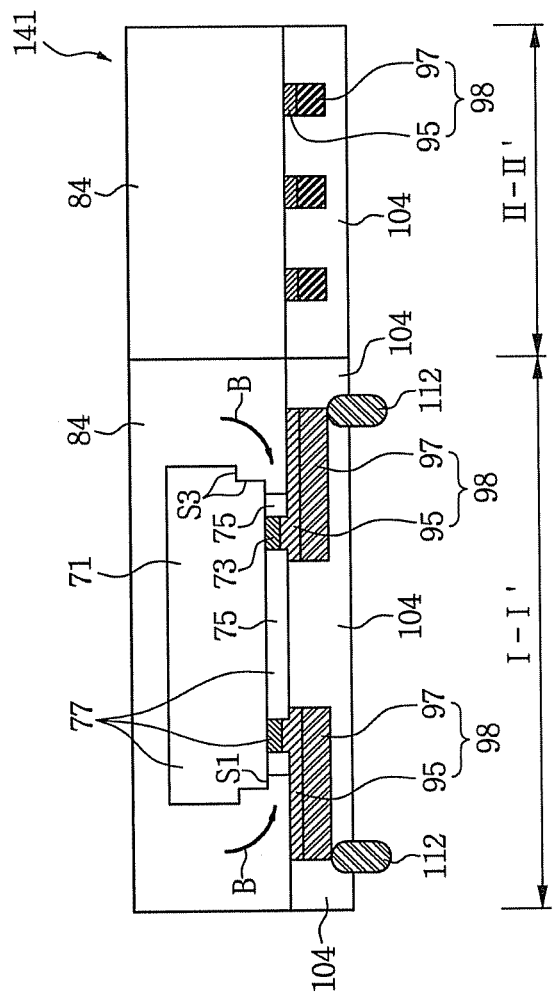

Referring to FIG. 8, according to example embodiments, before the supporting plate 62 and the housing chip 77 of FIG. 3 are prepared, the housing chip 77 may be singly prepared irrespective of the supporting plate 62. For example, the housing chip 77 may have the insulating layer 75 of FIG. 3, which may be disposed adjacent to the connection pads 73. The insulating layer 75 may expose a first surface S1 of a chip body 71. The first surfaces S1 may be substantially parallel to the insulating layer 75 along the insulating layer 75.

The first surfaces S1 may correspond to one of the horizontal planes of the chip body 71 of FIG. 2. The first surfaces S1 may be at a right angle with the sidewalls of the chip body 71 of FIG. 2. The first surfaces S1 of the chip body 71 may be selectively etched. The chip body 71 may have third surfaces S3 disposed between the first surfaces S1 and sidewalls thereof. The third surfaces S3 may form step shapes between the first surfaces S1 and the sidewalls thereof.

Subsequently, the processes described with reference to FIGS. 3 through 5 may be performed on the housing chip 77 to form a semiconductor housing package 141. In example embodiments, the mold layer 84 may fill grooves defined by the first and third surfaces S1 and S3 of the chip body 71 in the direction B of motion of volume thereof. Thus, the grooves defined by the first and third surfaces S1 and S3 of the chip body 71 may prevent separation of the mold layer 84 from the semiconductor housing package 141. The semiconductor housing package 141 may be disposed on the semiconductor base package 54 of FIG. 2.

Figure 9:
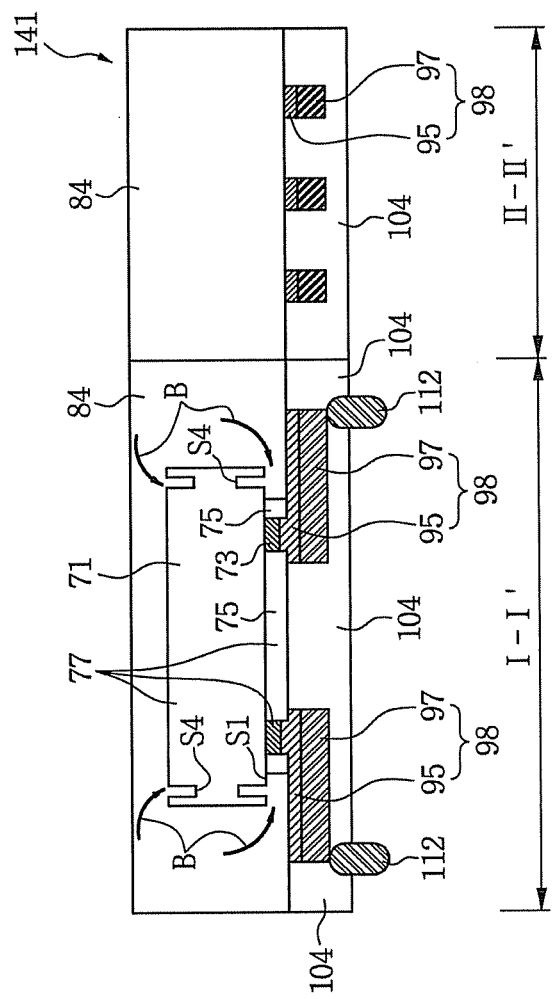

Referring to FIG. 9, according to example embodiments, before the supporting plate 62 and the housing chip 77 of FIG. 3 are prepared, the housing chip 77 may be singly processed irrespective of the supporting plate 62. To do this, the housing chip 77 may have the insulating layer 75 of FIG. 3, which may be disposed adjacent to the connection pads 73. The insulating layer 75 may expose a first surface S1 of a chip body 71. The first surfaces S1 may be substantially parallel to the insulating layer 75 along the insulating layer 75.

The first surfaces S1 may correspond to one of the horizontal planes of the chip body 71 of FIG. 2. The first surfaces S1 may be at a right angle with the sidewalls of the chip body 71 of FIG. 2. The first surfaces S1 of the chip body 71 may be selectively etched. Simultaneously, surfaces of the chip body 71 disposed opposite the first surfaces S1 may be selectively etched. The chip body 71 may have concaves formed in the first surfaces S1 and the surfaces disposed opposite the first surfaces S1.

The concaves may extend from the first surfaces S1 and the surfaces disposed opposite the first surfaces S1 toward the central region of the chip body 71. The concaves may be defined by fourth surfaces S4 of the chip body 71. The concaves formed in the first surfaces S1 may or may not face the concaves formed in the surfaces disposed opposite the first surfaces S1. Afterwards, the processes described with reference to FIGS. 3 through 5 may be performed on the housing chip 77 to form a semiconductor housing package 141.

In this case, the mold layer 84 may fill grooves and concaves defined by the first and fourth surfaces S1 and S4 of the chip body 71 in the direction B of motion of the volume thereof. Thus, the grooves and concaves defined by the first and fourth surfaces S1 and S4 of the chip body 71 may prevent separation of the mold layer 84 from the semiconductor housing package 141. The semiconductor housing package 141 may be disposed on the semiconductor base package 54 of FIG. 2.

Figure 10:
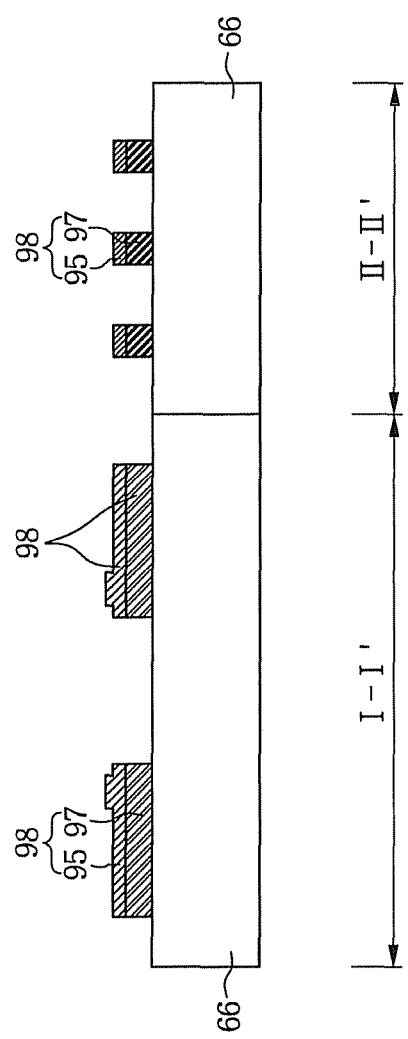
FIGS. 10 and 11 are cross-sectional views taken along lines I-I' and II-II' of FIG. 1, illustrating a method of forming a semiconductor housing package of a semiconductor package structure according to example embodiments
Figure 11:
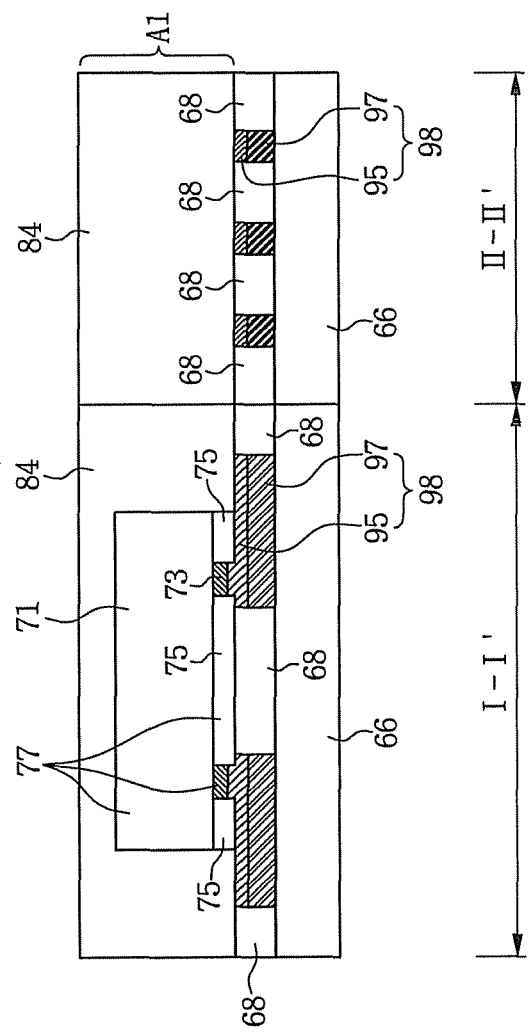

FIGS. 10 and 11 are cross-sectional views taken along lines I-I' and II-II' of FIG. 1, illustrating a method of forming a semiconductor housing package of a semiconductor package structure according to example embodiments. FIGS. 10 and 11 use like reference numerals for like members as shown in FIGS. 3 through 5.

Referring to FIGS. 10 and 11, according to example embodiments, a supporting plate 66 may be prepared as shown in FIG. 10. The supporting plate 66 may include the same material as or a different material from the supporting plate 62 of FIG. 3. Redistribution structures 98 may be formed on the supporting plate 62 as shown in FIG. 10. The redistribution structures 98 may include first and second conductive patterns 95 and 97. The mold structure A1 of FIG. 3 may be formed on the redistribution structures 98 as shown in FIG. 11.

The mold structure A1 may be aligned with the redistribution structures 98 through connection pads 73. The mold structure A1 may be electrically connected to the redistribution structures 73 through the connection pads 73 as shown in FIG. 11. The mold structure A1 and the supporting plate 66 may define vacant spaces 68 between the redistribution structures 98. Subsequently, the supporting plate 66 may be separated from the mold structure A1. The processes performed after forming the redistribution structures 98 of FIG. 5 may be performed on the mold structure A1.

After the processes are performed, the mold structure A1 and the redistribution structures 98 may form a semiconductor housing package 141 in the same shape as in FIG. 5.

Figure 12:
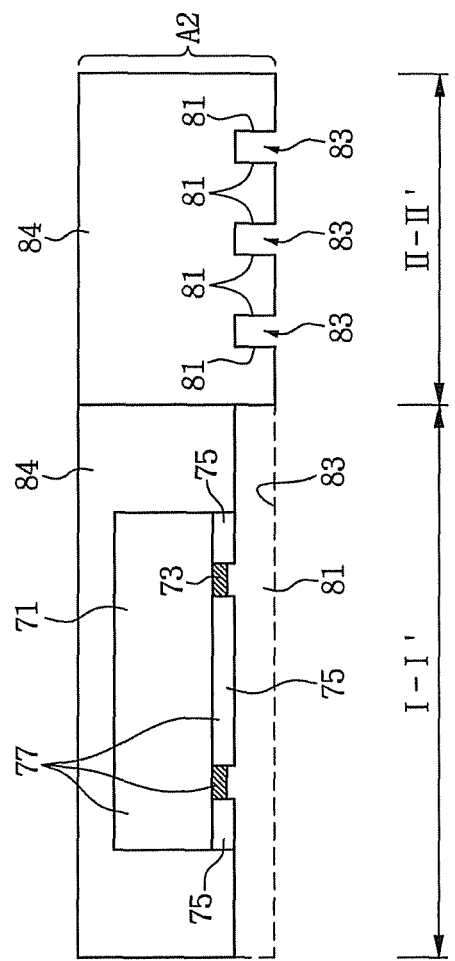
FIGS. 12 through 14 are cross-sectional views taken along lines I-P and II-II' of FIG. 1, illustrating a method of forming a semiconductor housing package of a semiconductor package structure according to example embodiments.
Figure 13:
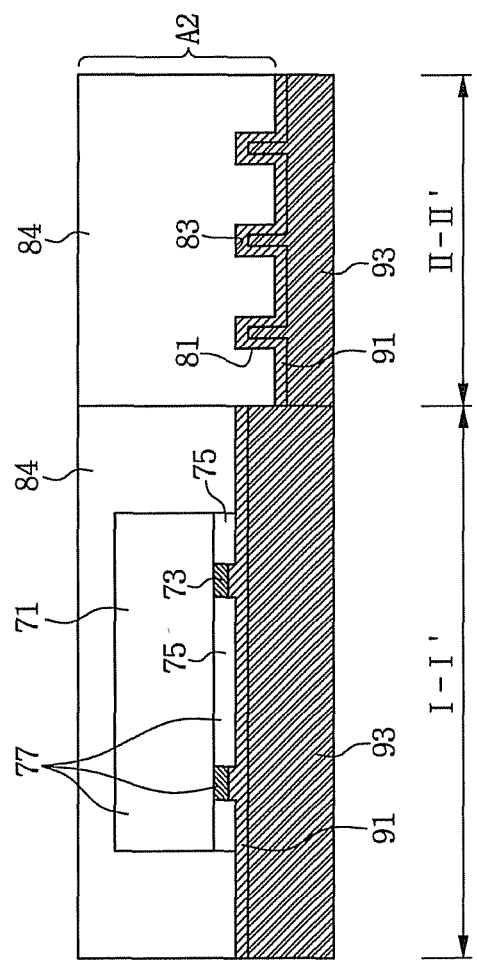
Figure 14:
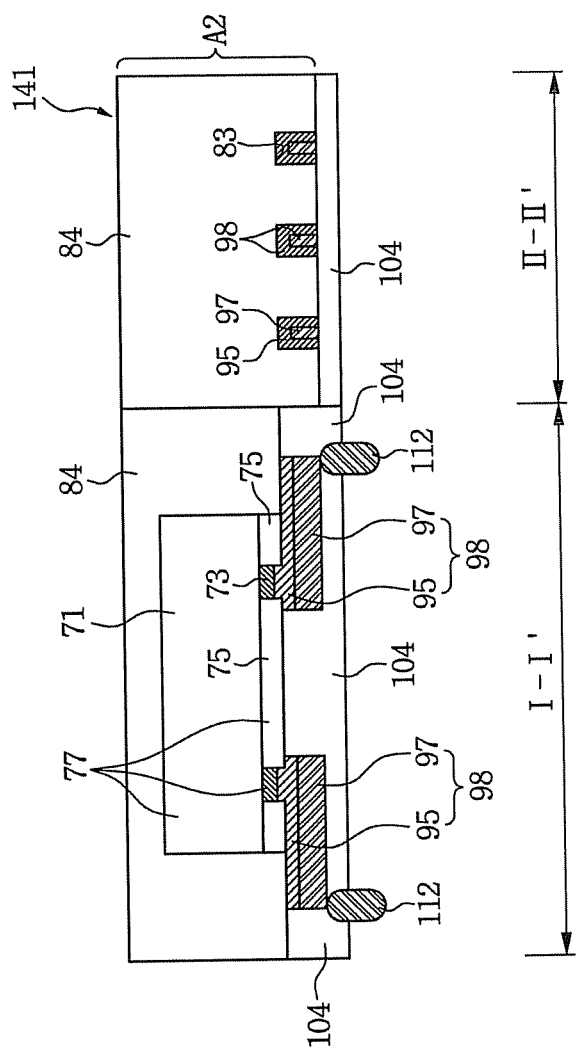

FIGS. 12 through 14 are cross-sectional views taken along lines I-I' and II-II' of FIG. 1, illustrating a method of forming a semiconductor housing package of a semiconductor package structure according to example embodiments. FIGS. 12 through 14 use like reference numerals for like members as shown in FIGS. 3 through 5.

Referring to FIG. 12, according to example embodiments, the molding body of FIG. 3 may be prepared. A mold layer 84 may be formed on the molding body. The molding body may define an outer surface surrounding the mold layer 84 and form a mounting portion in a predetermined region of the outer surface of the mold layer 84. The mounting portion may extend from the outer surface of the mold layer 84 to an inside of the mold layer 84. A housing chip 77 may be disposed on the mounting portion of the mold layer 84.

The housing chip 77 may be disposed on the mounting portion of the mold layer 84 to expose connection pads 73 and an insulating layer 75 through the mold layer 84. Heat may or may not be applied to the mold layer 84. In example embodiments, the mold layer 84 may surround and contact the housing chip 77 to cover the connection pads 73 and the insulating layer 75 of the housing chip 77. Photolithography and etching processes may be performed on the mold layer 84. During the photolithography and etching processes, the mold layer 84 may be etched to form trenches 83 in the mold layer 84.

The trenches 83 may expose the connection pads 73 of the housing chip 77 and partially expose the insulating layer 75. The trenches 83 may be aligned with the redistribution structures 98 of FIG. 5. Alternatively, before the housing chip 77 is mounted on the mold layer 84, a mold tool (not shown) may be applied to the mold layer 84 instead of performing the photolithography and etching processes. The mold tool may apply pressure to the mold layer 84. The mold layer 84 may be molded by the mold stool to form molded shapes in the mold layer 84.

The molded shapes may correspond to the trenches 83 of FIG. 10. After forming the molded shapes, the mold tool may be separated from the mold layer 84. The housing chip 77 may be mounted on the mounting portion of the mold layer 84. Thus, the mold layer 84 and the housing chip 77 may constitute the mold structure A2.

Referring to FIG. 13, according to example embodiments, the molding body may be separated from the mold structure A2. A first conductive layer 91 and a second conductive layer 93 may be sequentially formed on the housing chip 77 and the mold layer 84 to fill the trenches 83. In example embodiments, the first conductive layer 91 may contact the connection pads 73 of the housing chip 77 and conformally cover the trenches 83. The second conductive layer 93 may be disposed on the first conductive layer 91 to fill the trenches 83.

Referring to FIG. 14, according to example embodiments, photolithography and etching processes may be performed on the first and second conductive layers 91 and 93. During the photolithography and etching processes, the first and second conductive layers 91 and 93 may be etched to form first and second conductive patterns 95 and 97. From a vertical view, the first and second conductive patterns 95 and 97 may fill the trenches 83. From a horizontal view, the first and second conductive patterns 95 and 97 may be partially formed along the trenches 83.

The first and second conductive patterns 95 and 97 may expose the insulating layer 75 of the housing chip 77 and the mold layer 84. The first and second conductive patterns 95 and 97 may extend from the housing chip 77 toward the mold layer 84. The first and second conductive patterns 95 and 97 may constitute redistribution structures 98. A protection layer 104 may be formed on the insulating layer 75 of the housing chip 77 and the mold layer 84 to cover the redistribution structures 98.

The protection layer 104 may protrude from the trenches 83 to fill the trenches 83. The protection layer 104 may partially expose the redistribution structures 98 through openings. Housing nodes 112 may be formed in the protection layer 104. The housing nodes 112 may be in contact with the redistribution structures 98 through the openings of the protection layer 104. The housing nodes 112 may protrude from the protection layer 104. The housing nodes 112, the mold structure A2, the redistribution structures 99, and the protection layer 104 may constitute a semiconductor housing package 141.

Alternatively, the semiconductor housing package 141 may include the redistribution structures 98, the protection layer 104, and/or the housing nodes 112, which are printed using the inkjet process of FIG. 5. In this case, the redistribution structures 98, the protection layer 104, and/or the housing nodes 112 may have the same structure and shape as in FIG. 14. The semiconductor housing package 141 may be disposed on the semiconductor base package 54 of FIG. 2.

Figure 15:
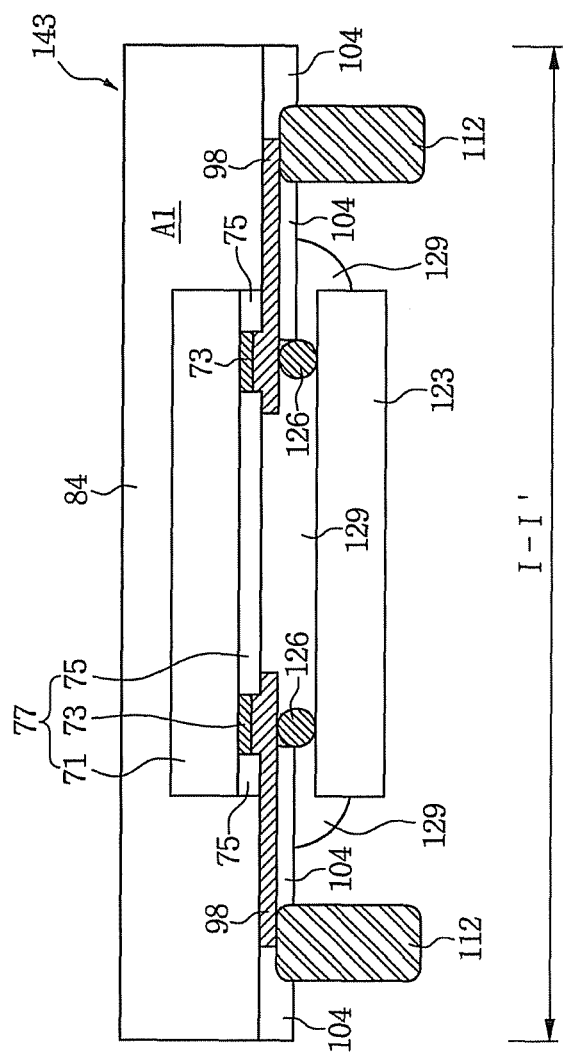
FIG. 15 is a cross-sectional view taken along line I-I' of FIG. 1, illustrating a method of forming a semiconductor housing package of a semiconductor package structure according to example embodiments.

FIG. 15 is a cross-sectional view taken along line I-I' of FIG. 1, illustrating a method of forming a semiconductor housing package of a semiconductor package structure according to example embodiments. FIG. 15 uses like reference numerals for like members as shown in FIGS. 3 through 5.

Referring to FIG. 15, according to example embodiments, the mold structure A1 of FIG. 3 may be prepared. The redistribution structures 98 of FIG. 5 may be formed on the mold structure A1. A protection layer 104 may be formed on the housing chip 77 and the mold layer 84 to cover the redistribution structures 98. Photolithography and etching processes may be performed on the protection layer 104. During the photolithography and etching processes, first and second openings may be formed in the protection layer 104. The first openings of the protection layer 104 may expose one ends of the redistribution structures 98 under the mold layer 84.

The second opening of the protection layer 104 may expose the other ends of the redistribution structures 98 under connection pads 73. Furthermore, the second opening of the protection layer 104 may expose an insulating layer 75 between the redistribution structures 98. Housing nodes 112 may be formed in the first openings of the protection layer 104. The housing nodes 112 may be surrounded by the protection layer 104 and protrude from the protection layer 104. In example embodiments, the redistribution structures 98, the protection layer 104, and the housing patterns 112 may be formed using the processes described with reference to FIGS. 4 and 5.

However, the protection layer 104 may be printed on the mold structure A1 using an inkjet process to expose the redistribution structures 98 as shown in FIG. 15. An auxiliary housing chip 123 may be formed at least one between the housing nodes 112. The auxiliary housing chip 123 may include the same semiconductor circuit as or a different semiconductor circuit from the housing chip 77. The auxiliary housing chip 123 may be disposed under the housing chip 77 through the second opening of the protection layer 104.

The auxiliary housing chip 123 may have connection balls 126. The connection balls 126 may include a conductive material. The connection balls 126 may be electrically connected to the semiconductor circuit of the auxiliary housing chip 123. The connection balls 126 may be in contact with the redistribution structures 98. The connection balls 126 may be in contact with the auxiliary housing chip 123. The connection balls 126 may be interposed between the redistribution structures 98 and the auxiliary housing chip 123 so that the auxiliary housing chip 123 can be electrically connected to the redistribution structures 98.

A house filler 129 may be formed on the protection layer 104. The house filler 129 may include an insulating material. The house filler 129 may at least cover the auxiliary housing chip 123. The house filler 129 may fill spaces among the insulating layer 75 of the housing chip 77, the redistribution structures 98, the protection layer 104, the auxiliary housing chip 123, and the connection balls 126. Thus, the auxiliary housing chip 123, the mold structure A1, the redistribution structures 98, the protection layer 104, and the housing nodes 112 may constitute a semiconductor housing package 143.

The semiconductor housing package 143 may be disposed on the semiconductor base package 54 of FIG. 2.

Figure 16:
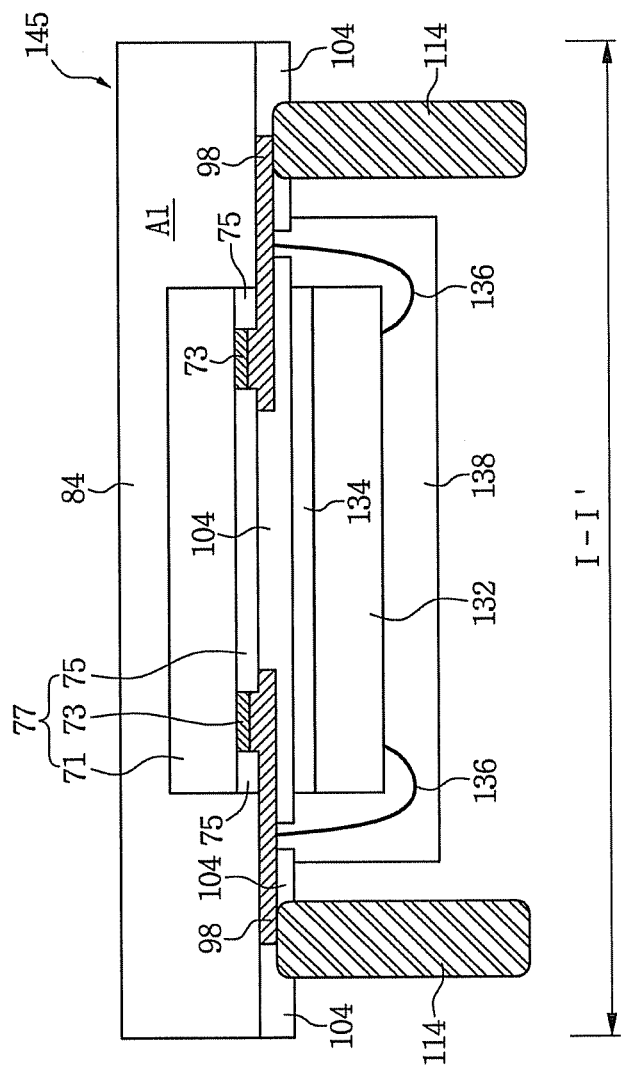
FIG. 16 is a cross-sectional view taken along line I-I' of FIG. 1, illustrating a method of forming a semiconductor housing package of a semiconductor package structure according to example embodiments.

FIG. 16 is a cross-sectional view taken along line I-I' of FIG. 1, illustrating a method of forming a semiconductor housing package of a semiconductor package structure according to example embodiments. FIG. 16 uses like reference numerals for like members as shown in FIGS. 3 through 5.

Referring to FIG. 16, according to example embodiments, the mold structure A1 of FIG. 3 may be prepared. The redistribution structures 98 of FIG. 5 may be formed on the mold structure A1. A protection layer 104 may be formed on a housing chip 77 and a mold layer 84 to cover the redistribution structures 98. Photolithography and etching processes may be performed on the protection layer 104. During the photolithography and etching processes, first and second openings may be formed in the protection layer 104. The first and second openings may be sequentially formed in the protection layer 104 from the mold layer 84 toward the housing chip 77. For example, the first and second openings may be formed perpendicular to a bottom surface of the housing chip 77.

The first and second openings aimed in the protection layer 104 may expose the redistribution structures 98 under the mold layer 84. The first openings formed in the protection layer 104 may expose one ends of the redistribution structures 98 under the mold layer 84. The second openings formed in the protection layer 104 may expose the other ends of the redistribution structures 98 under connection pads 73. Housing nodes 114 may be formed in the first openings of the protection layer 104. The housing nodes 114 may be surrounded by the protection layer 104.

The housing nodes 114 may protrude from the protection layer 104 to a different size than the housing nodes 112 of FIG. 15. In example embodiments, the redistribution structures 98, the protection layer 104, and the housing nodes 114 may be formed using the processes described with reference to FIGS. 4 and 5. However, the protection layer 104 may be printed on the mold structure A using an inkjet process to expose the redistribution structures 98 as shown in FIG. 16. An auxiliary housing chip 132 may be formed between the housing nodes 114.

The auxiliary housing chip 132 may include the same semiconductor circuit as or a different semiconductor circuit from the housing chip 77. In this case, the auxiliary housing chip 132 may be disposed under the housing chip 77. The auxiliary housing chip 132 may be adhered to the protection layer 104 using an adhesive 134. The adhesive 134 may include an insulating material. Lead lines 136 may be formed adjacent to the auxiliary housing chip 132. The lead lines 136 may electrically connect the redistribution structures 98 to the auxiliary housing chip 132 through the second openings of the protection layer 104.

The lead lines 136 may be in contact with the redistribution structures 98. The lead lines 136 may be in contact with the auxiliary housing chip 132. The lead lines 136 may be electrically connected to the semiconductor circuit of the auxiliary housing chip 132. The lead lines 136 may include a conductive material. A housing cover layer 138 may be formed on the protection layer 104 to cover the lead lines 136. The housing cover layer 138 may be formed between the housing nodes 114.

The housing cover layer 138 may cover the redistribution structures 98, the auxiliary housing chip 132, and the adhesive 134. The housing cover layer 138 may include an EMC. Thus, the auxiliary housing chip 132, the mold structure A1, the redistribution structures 98, the protection layer 104, and the housing nodes 114 may constitute a semiconductor housing package 145. The semiconductor housing package 145 may be disposed on the semiconductor base package 54 of FIG. 2.

Figure 17:
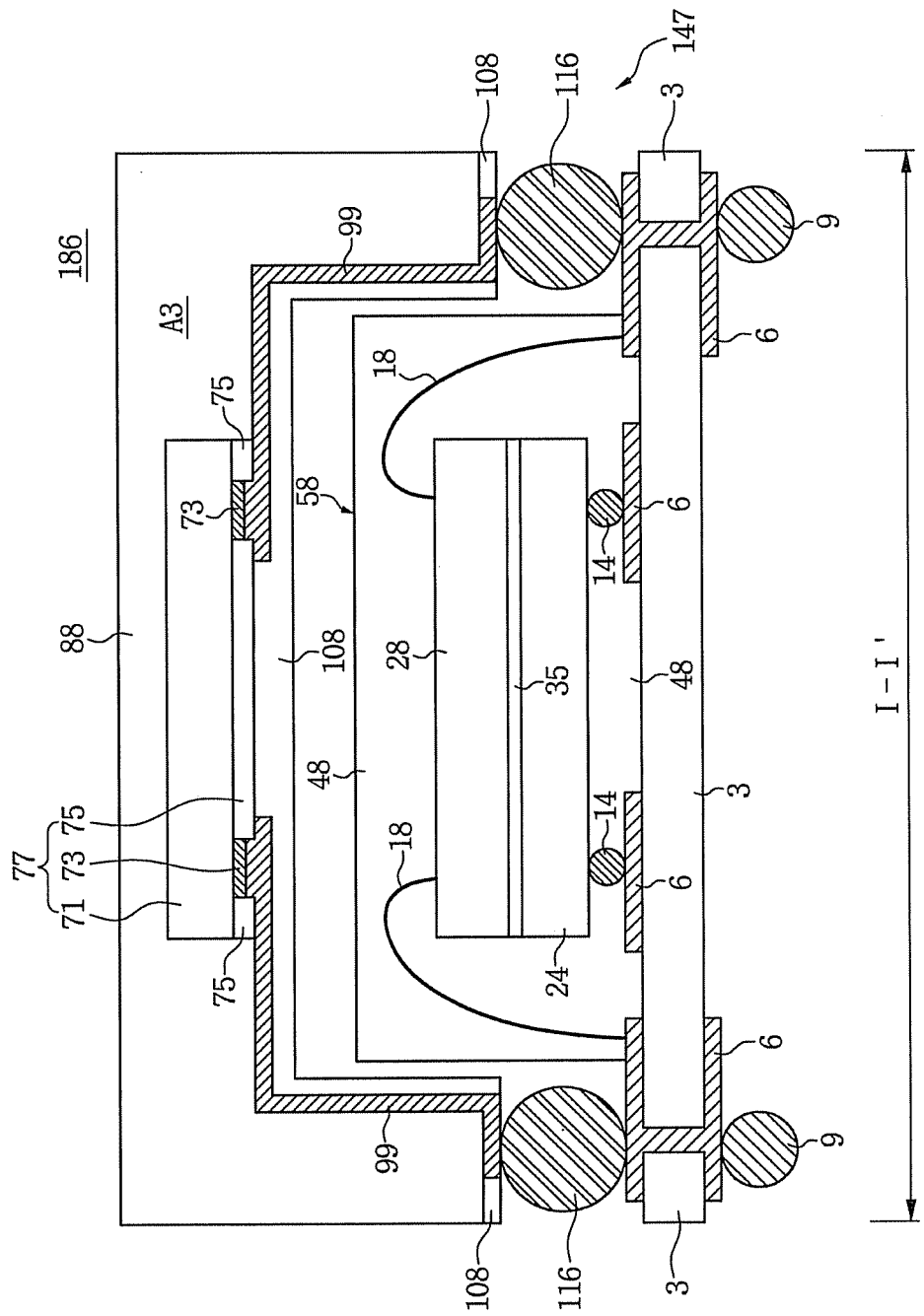
FIG. 17 is a cross-sectional view taken along line I-I' of FIG. 1, illustrating a method of forming a semiconductor package structure according to example embodiments.

FIG. 17 is a cross-sectional view taken along line I-I' of FIG. 1, illustrating a method of forming a semiconductor package structure according to example embodiments. FIG. 17 uses like reference numerals for like members as shown in FIGS. 2 through 5.

Referring to FIG. 17, according to example embodiments, a mold structure A3 may be prepared. The mold structure A3 may include a housing chip 77 and a mold layer 88. The housing chip 77 may include a chip body 71, connection pads 73, and an insulating layer 75. The housing chip 77 may be obtained using the processes described with reference to FIG. 2 or 3. The mold layer 88 may surround the housing chip 77 and partially expose the housing chip 77. The mold layer 88 may expose the connection pads 73 and the insulating layer 75.

The mold layer 88 may have a concave shape in the vicinity of the housing chip 77. The mold layer 88 may include the same material as the mold layer 84 of FIG. 2 or 3. Redistribution structures 99 may be formed on the insulating layer 75 and the mold layer 88. The redistribution structures 99 may be obtained using the processes described with reference to FIG. 5. The redistribution structures 99 may extend from the housing chip 77 toward side portions of the concave shape of the mold layer 88.

In example embodiments, one ends of the redistribution structures 99 may contact the connection pads 73, while the other ends thereof may be formed on ends of the side portions of the concave shape of the mold layer 88. The redistribution structures 99 may include the same material as the redistribution structures 98 of FIG. 2 or 3. A protection layer 108 may be formed on the redistribution structures 99. The protection layer 108 may cover the insulating layer 75, the mold layer 88, and the redistribution structures 99 and expose the redistribution structures 99 from the ends of the side portions of the concave shape of the mold layer 88.

The protection layer 108 may be obtained using the processes described with reference to FIG. 5. The protection layer 108 may include the same material as the protection layer 104 of FIG. 2 or 5. Housing nodes 116 may be formed on the redistribution structures 99. The housing nodes 116 may include the same material as the housing nodes 112 of FIG. 5. The housing nodes 116 may protrude from the redistribution structures 99 or the redistribution structures 99 and the protection layer 108.

The protection layer 108 may constitute a semiconductor housing package 147 together with the mold structure A3, the redistribution structures 99, and the housing nodes 116. Subsequently, the circuit substrate 3 of FIG. 2 may be prepared. The circuit substrate 3 may include landing pads 6 and substrate nodes 9. The landing pads 6 may include first and second landing pads. The first landing pads 6 may be disposed on an edge of the circuit substrate 3.

The second landing pads 6 may be disposed between the edge and a central region of the circuit substrate 3. The substrate nodes 9 may be in contact with first landing pads 6. A base chip may be disposed on the second landing pads 6. The base chip may include first and second base chips 24 and 28. The first base chip 24 may include connection balls 14. The connection balls 14 may be electrically connected to a semiconductor circuit of the first base chip 24.

The connection balls 14 may be in contact with the second landing pads 6. The connection balls 14 may electrically connect the first base chip 24 to the second landing pads 6. An adhesive 35 may be formed on the first base chip 24. The second base chip 28 may be formed on the adhesive 35. The second base chip 28 may have the same semiconductor circuit as or a different semiconductor circuit from the first base chip 24. Lead lines 18 may be formed in the vicinity of the first and second base chips 24 and 28.

The lead lines 18 may extend from the first landing pads 6 toward the second base chip 28. The lead lines 18 may be in contact with the first landing pads 6 and the second base chip 28. The lead lines 18 may be electrically connected to the semiconductor circuit of the second base chip 28. The lead lines 18 may include a conductive material. A base cover layer 48 may be formed on the circuit substrate 3 to cover the lead lines 18.

The base cover layer 48 may fill spaces between the circuit substrate 3, the second landing pads 6, the connection balls 14, and the first base chip 24 and cover the first and second base chips 24 and 28. The base cover layer 48 may partially cover the first landing pads 6. The base cover layer 48 may adhere the first and second base chips 24 and 28 to the circuit substrate 3. The base cover layer 48, the circuit substrate 3, and the first and second base chips 24 and 28 may constitute a semiconductor base package 58.

Thereafter, the semiconductor base package 58 may be disposed under the semiconductor housing package 147. The first landing pads 6 of the semiconductor base package 58 may be in contact with the housing nodes 116 of the semiconductor housing package 58. In this case, the first and second base chips 24 and 28 may be defined by a length of the side portions of the concave shape of the mold layer 88 and a thickness of the housing nodes 116 in a direction of a thickness of the housing chip 77 and formed between the housing nodes 116.

The first and second base chips 24 and 28 may be inserted between the side portions of the concave shape of the mold layer 88. A thickness of the first and second base chips 24 and 28 may be substantially equal to or different from a thickness of each of the housing nodes 116 in a direction of the thickness of the housing chip 77. Thus, the semiconductor base package 58 and the semiconductor housing package 147 may constitute a semiconductor package structure 186. In the alternative, the semiconductor housing package 147 may be disposed on the semiconductor base package 54 of FIG. 2.

Figure 18:
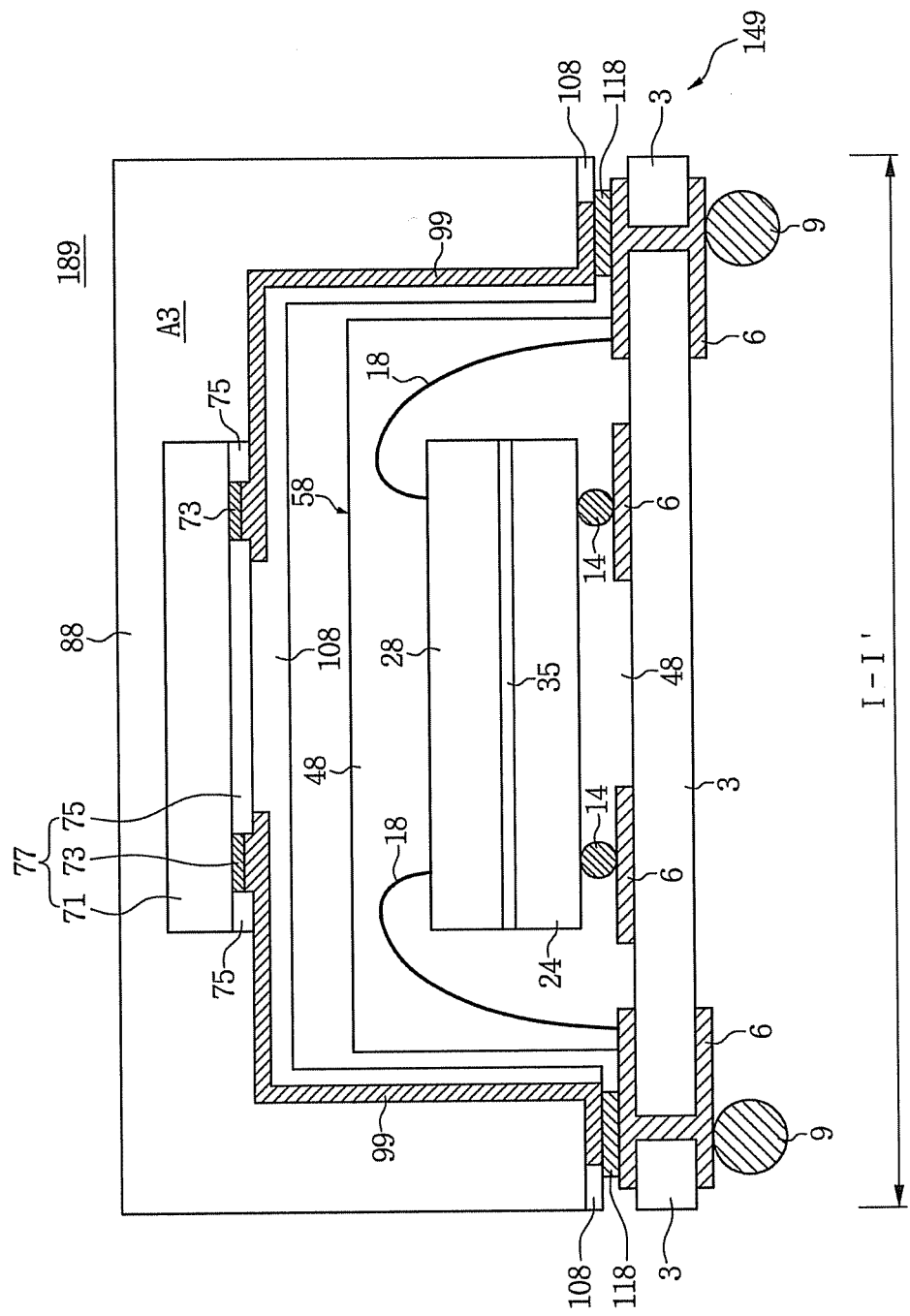
FIG. 18 is a cross-sectional view taken along line I-I' of FIG. 1, illustrating a method of forming a semiconductor package structure according to example embodiments.

FIG. 18 is a cross-sectional view taken along line I-I' of FIG. 1, illustrating a method of forming a semiconductor package structure according to example embodiments. FIG. 18 uses like reference numerals for like members as shown in FIGS. 2 through 5.

Referring to FIG. 18, according to embodiments, the mold structure A3, the redistribution structures 99, and the protection layer 108 of FIG. 17 may be prepared. The redistribution structures 99 and the protection layer 108 may have the same shape as in FIG. 17 on the mold structure A3. Housing nodes 118 may be formed on the redistribution structures 99 or the redistribution structures 99 and the protection layer 108. The housing nodes 118 may include the same material as or a different material from the housing nodes 112 of FIG. 5. The housing nodes 118 may be formed on ends of side portions of a concave shape of the mold layer 88.

A thickness of each of the housing nodes 118 may be substantially equal to a thickness of each of the redistribution structures 99 in a direction of a thickness of the redistribution structures 99. The housing nodes 118 may constitute a semiconductor housing package 149 together with the mold structure A3, the redistribution structures 99, and the protection layer 108. Thereafter, the semiconductor base package 58 of FIG. 17 may be prepared. The semiconductor base package 58 may be disposed under the semiconductor housing package 149.

First landing pads 6 of the semiconductor base package 58 may be in contact with the housing nodes 118 of the semiconductor housing package 149. The semiconductor base package 58 and the semiconductor housing package 149 may be electrically connected to each other by the first landing pads 6 and the housing nodes 118. In example embodiments, a first and second base chips 24 and 28 of the semiconductor base package 58 may be inserted between the side portions of the concave shape of the mold layer 88.

The first and second base chips 24 and 28 may be defined by a length of the side portions of the concave shape of the mold layer 88 and a thickness of the housing nodes 118 in a direction of a thickness of the housing chip 77. Thus, the semiconductor base package 58 and the semiconductor housing package 149 may constitute a semiconductor package structure 189. In the alternative, the semiconductor housing package 149 may be disposed on the semiconductor base package 54 of FIG. 2.

Figure 19:
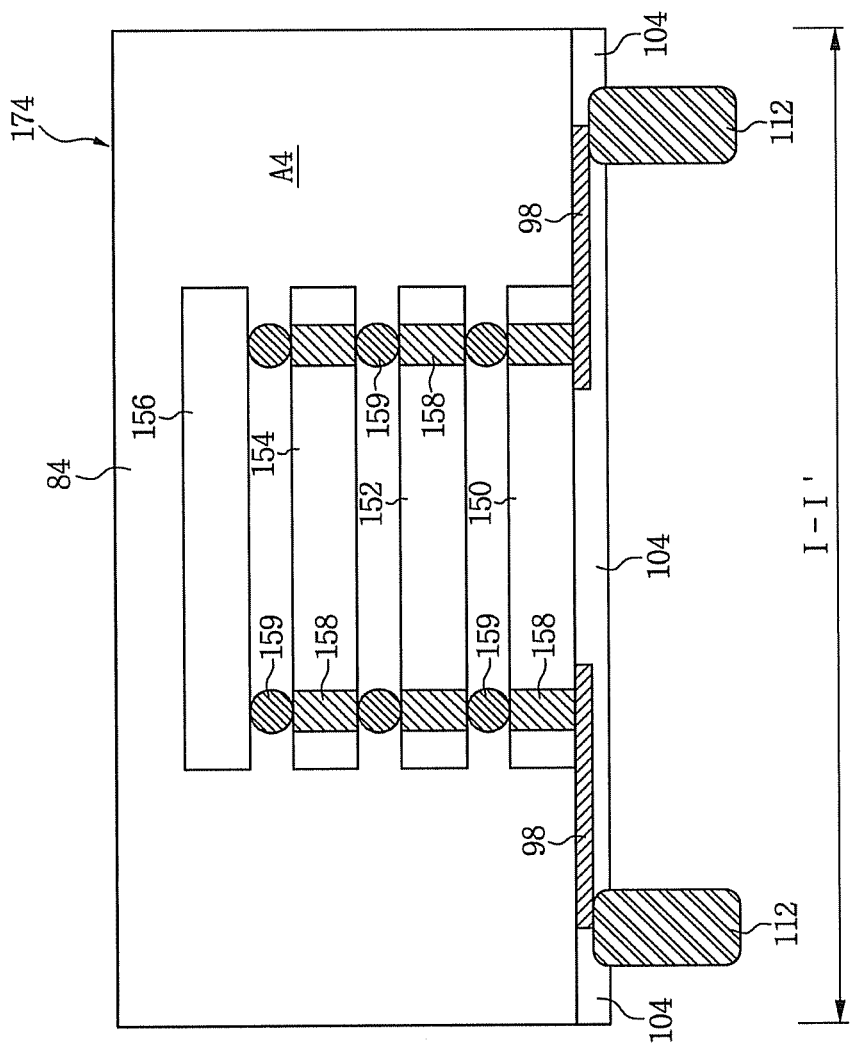
FIG. 19 is a cross-sectional view taken along line I-I' of FIG. 1, illustrating a method of forming a semiconductor housing package of a semiconductor package structure according to example embodiments.

FIG. 19 is a cross-sectional view taken along line I-I' of FIG. 1, illustrating a method of forming a semiconductor housing package of a semiconductor package structure according to example embodiments. FIG. 19 uses like reference numerals for like members as shown in FIGS. 3 through 5.

Referring to FIG. 19, according to example embodiments, the supporting plate 62 of FIG. 3 may be prepared. A housing chip may be disposed on the supporting plate 62. The housing chip may include first through fourth housing chips 150, 152, 154, and 156 at least, which are sequentially stacked. Each of the first through fourth housing chips 150, 152, 154, and 156 may include a semiconductor circuit. The first through third housing chips 150, 152, and 154 may have through-silicon vias (TSVs) 158 and bumps 159.

The TSVs 158 may be disposed through the first through third housing chips 150, 152, and 154. The TSVs 158 may be electrically connected to the semiconductor circuits of the first through third housing chips 150, 152, and 154. The TSVs 158 may include a conductive material. The bumps 159 may be disposed on the TSVs 158 to contact the TSVs 158.

The bumps 159 may be interposed between the first through fourth housing chips 150, 152, 154, and 156 to electrically connect the first through fourth housing chips 150, 152, 154, and 156. In example embodiments, the bumps 159 of the third housing chip 154 may be electrically connected to the semiconductor circuit of the fourth housing chip 156. The bumps 159 may include a conductive material. A mold layer 84 may be formed on the supporting plate 62 to cover the first through fourth housing chips 150, 152, 154, and 156.

The mold layer 84 may fill spaces among the first through fourth housing chips 150, 152, 154, and 156 and the bumps 159. The mold layer 84 and the first through fourth housing chips 150, 152, 154, and 156 may constitute the mold structure A4. The supporting plate 62 may be separated from a mold structure A4. Afterwards, redistribution structures 98, a protection layer 104, and housing nodes 112 may be sequentially formed on the mold structure A4.

In example embodiments, the redistribution structures 98 may be in contact with the TSVs 158. The redistribution structures 98 may be electrically connected to the semiconductor circuit of the first housing chip 150 through the TSVs 158 of the first housing chip 150. The redistribution structures 98, the protection layer 104, and the housing nodes 112 may be formed using the processes described with reference to FIGS. 4 and 5. Thus, the redistribution structures 98, the protection layer 104, and the housing nodes 112 may constitute a semiconductor housing package 174 along with the mold structure A4.

The semiconductor housing package 174 may be disposed on the semiconductor base package 54 of FIG. 2.

Figure 20:
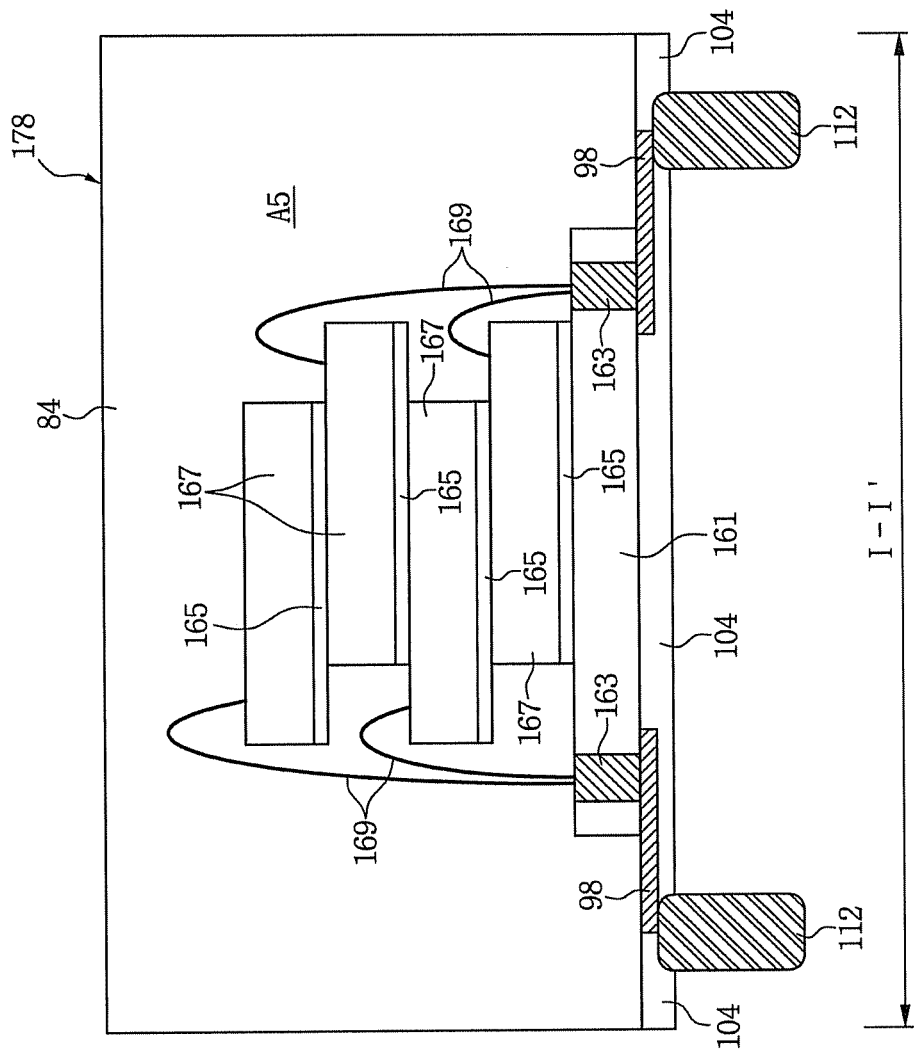
FIG. 20 is a cross-sectional view, taken along line I-I' of FIG. 1, illustrating a method of forming a semiconductor housing package of a semiconductor package structure according to example embodiments.

FIG. 20 is a cross-sectional view taken along line I-I' of FIG. 1, illustrating a method of forming a semiconductor housing package of a semiconductor package structure according to example embodiments. FIG. 20 uses like reference numerals for like members as shown in FIGS. 3 through 5.

Referring to FIG. 20, according to example embodiments, the supporting plate 62 of FIG. 3 may be prepared. A housing chip may be disposed on the supporting plate 62. The housing chip may include first and second housing chips 161 and 167 at least, which are sequentially stacked. The first housing chip 161 may have a semiconductor circuit. The semiconductor circuit may singly refer to a logic circuit or logic and memory circuits. The first housing chip 161 may have TSVs 163.

The TSVs 163 may be formed through the first housing chip 161. The TSVs 163 may be electrically connected to the semiconductor circuit of the first housing chip 161. Second housing chips 167 may be formed on the first housing chip 161. The second housing chips 167 may be formed on the first housing chip 161 to expose each other. The second housing chips 167 may have the same semiconductor circuit as or a different semiconductor circuit from the first housing chip 161.

The housing chip may further have adhesives 165 and lead lines 169. The adhesives 165 may be formed between the first and second housing chips 161 and 167. The adhesives 165 may adhere the second housing chips 167 to the first housing chip 161. The adhesives 165 may include an insulating material. The lead lines 169 may be formed adjacent to the second housing chips 167. The lead lines 169 may extend from the TSVs 163 toward the second housing chips 167.

The lead lines 169 may be in contact with the TSVs 163 and the second housing chips 167. The lead lines 169 may be electrically connected to the semiconductor circuits of the second housing chips 167. The lead lines 169 may include a conductive material. Afterwards, a mold layer 84 may be formed on the supporting plate 62 to cover the lead lines 169. The mold layer 84 may cover the first and second housing chips 161 and 167 to fill spaces between the first and second housing chips 161 and 167.

The mold layer 84 may constitute a mold structure A5 along with the first and second housing chips 161 and 167. In example embodiments, the supporting plate 62 may be separated from the mold structure A5. Redistribution structures 98, a protection layer 104, and housing nodes 112 may be sequentially formed on the mold structure A5. In example embodiments, the redistribution structures 98 may be in contact with the TSVs 163. The redistribution structures 98 may be electrically connected to the semiconductor circuit of the first housing chip 161 through the TSVs 163 of the first housing chip 161.

The redistribution structures 98, the protection layer 104, and the housing nodes 112 may be formed using the processes described with reference to FIGS. 4 and 5. Thus, the redistribution structures 98, the protection layer 104, and the housing nodes 112 may constitute a semiconductor housing package 178 along with the mold structure A5. The semiconductor housing package 178 may be disposed on the semiconductor base package 54 of FIG. 2.

Figure 21:
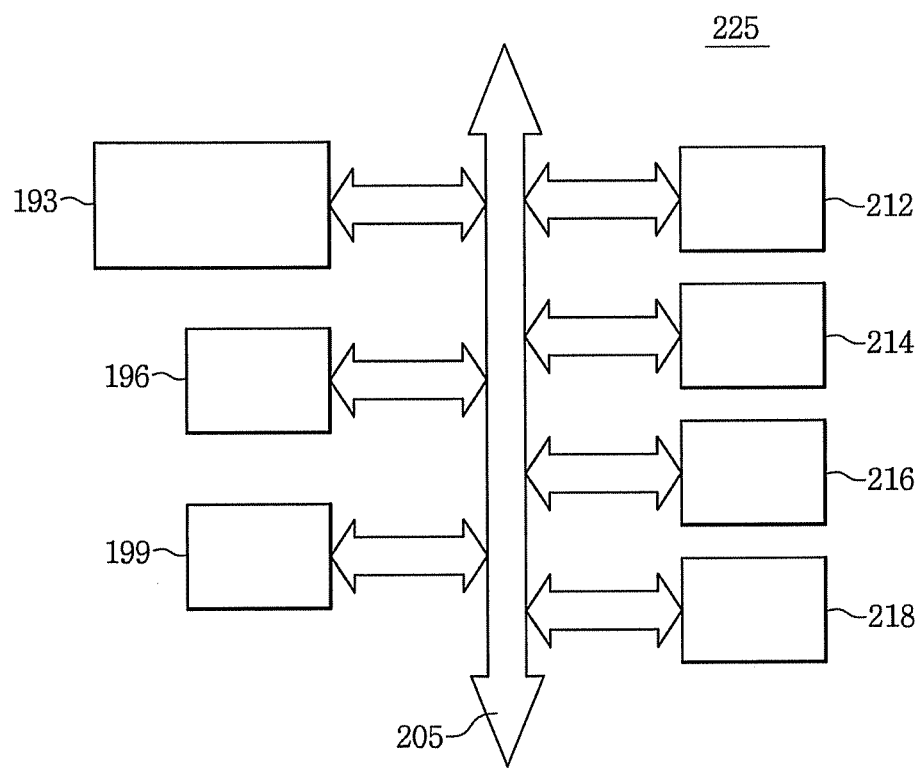
FIG. 21 is a plan view of a processor-based system including at least one of the semiconductor package structures of FIG. 1.

FIG. 21 is a plan view of a processor-based system including at least one of the semiconductor package structures of FIG. 1.

Referring to FIG. 21, a processor-based system 225 according to example embodiments may include at least one system board (not shown). The at least one system board may have at least one bus line 205. A first module unit may be disposed on the at least one bus line 205. The first module unit may be electrically connected to the at least one bus line 205.

The first module unit may include a central processing unit (CPU) 193, a floppy disk drive (FDD) 196, and a compact disk (CD) read-only memory (ROM) drive 199. In addition, a second module unit may be disposed on the at least one bus line 205. The second module unit may be electrically connected to the at least one bus line 205.

The second module unit may include a first input/output (I/O) device 212, a second I/O device 214, a ROM 216, and a random access memory (RAM) 218. The first module unit and/or the second module unit may include at least one of the semiconductor package structures 183, 186, and 189 of FIG. 1. Thus, the processor-based system 225 may be fabricated to have a simpler internal structure and a lower fabrication cost than in the conventional art.

The processor-based system 225 may include a computer system, a process control system, or another system.

As described above, unlike in the conventional art, example embodiments may provide a semiconductor housing package that may electrically connect a housing chip to an external apparatus without using a PCB. In example embodiments, the housing chip may be surrounded by a mold layer and redistribution structures in the semiconductor housing package. The mold layer may be an EMC. The redistribution structures may include a conductive material.

Example embodiments may provide a semiconductor package structure including a semiconductor base package using the PCB and the semiconductor housing package without using the PCB. The semiconductor housing package may be disposed on the semiconductor base package and electrically connected to the semiconductor base package. The semiconductor housing package may facilitate fabrication of a more highly integrated semiconductor package structure than in the conventional art.

Furthermore, example embodiments may provide a processor-based system including the semiconductor package structure having the semiconductor base package and the semiconductor housing package. Since the semiconductor package structure uses the semiconductor housing package, an internal structure of the processor-based system may be simpler than in the conventional art. The semiconductor package structure may minimize the number of times the PCB is used, thereby reducing the fabrication cost of the processor-based system.

The foregoing is illustrative of example embodiments and is not to be construed as limiting thereof. Although example embodiments have been described, those skilled in the art will readily appreciate that many modifications are possible in example embodiments without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other embodiments, are intended to be included within the scope of the appended claims.

What is claimed is:

1. A semiconductor housing package, comprising:
a mold layer;
a housing chip in the mold layer, the housing chip exposed by the mold layer;
redistribution structures extending from the housing chip and along a bottom surface of the mold layer, the redistribution structures being electrically connected to the housing chip; and
at least one housing node contacting the redistribution structures and protruding from the redistribution structures; and
an auxiliary housing chip under the housing chip;
wherein the auxiliary housing chip is electrically connected to the redistribution structures through one of a connection ball and a lead line, the one of the connection ball and the lead line contacting the auxiliary housing chip and the redistribution structures.

2. A semiconductor housing package, comprising:
a mold layer;
a housing chip in the mold layer, the housing chip exposed by the mold layer;
redistribution structures extending from the housing chip and along a bottom surface of the mold layer, the redistribution structures being electrically connected to the housing chip; and
at least one housing node contacting the redistribution structures and protruding from the redistribution structures;
wherein the housing chip includes first and second housing chips, the second housing chip being electrically connected to the redistribution structures through a through-silicon via (TSV), the TSV penetrating the first housing chip and contacting the redistribution structures.

3. The semiconductor housing package of claim 2, wherein the second housing chip is connected to the TSV by a lead line, the TSV penetrating and contacting the lead line and the redistribution structures, and the lead line extending from the TSV toward the second housing chip and electrically connected to the second housing chip.

4. The semiconductor housing package of claim 2, wherein the second housing chip is connected to the TSV by a bump, the TSV penetrating and contacting the bump and the redistribution structures, and the bump being on the TSV and electrically connected to the second housing chip.

5. A semiconductor package structure, comprising:
a semiconductor housing package; and
a semiconductor base package including a circuit substrate electrically connected to at least one housing node of the semiconductor housing package;
wherein the semiconductor housing package comprises,
a mold layer;
a housing chip in the mold layer, the housing chip exposed by the mold layer;
redistribution structures extending from the housing chip and along a bottom surface of the mold layer, the redistribution structures being electrically connected to the housing chip; and
the at least one housing node contacting the redistribution structures and protruding from the redistribution structures;
wherein the at least one housing node includes at least two housing nodes on the circuit substrate, and
wherein the semiconductor base package further includes a base chip on the circuit substrate and between the at least two housing nodes.

6. The semiconductor package structure of claim 5, wherein the semiconductor base package further includes first landing pads and second landing pads on the circuit substrate, the first landing pads and the second landing pads being electrically connected to the circuit substrate, the first landing pads being on edges of the circuit substrate, and the second landing pads being between the edges and a central region of the circuit substrate.

7. The semiconductor package structure of claim 6, wherein the mold layer has a substantially flat shape in a vicinity of the housing chip, a thickness of the base chip is smaller than a thickness of each of the at least two housing nodes in a direction of a thickness of the housing chip, the first landing pads are in contact with the at least two housing nodes, and the second landing pads are electrically connected to the base chip through connection balls.

8. The semiconductor package structure of claim 6, wherein the mold layer has a concave shape in a vicinity of the housing chip, the at least two housing nodes are on ends of side portions of the concave shape of the mold layer, a thickness of each of the at least two housing nodes is substantially equal to a thickness of the base chip in a direction of a thickness of the housing chip, and the base chip includes a second base chip on a first base chip, and
wherein the first and second base chips are between the side portions of the concave shape of the mold layer, the first landing pads are in contact with the at least two housing nodes, the second landing pads are electrically connected to the first base chip through connection balls, and the second base chip is electrically connected to the first landing pads through lead lines.

9. The semiconductor package structure of claim 6, wherein the mold layer has a concave shape in a vicinity of the housing chip, the at least two housing nodes are on ends of side portions of the concave shape of the mold layer, a thickness of each of the at least two housing nodes is substantially equal to a thickness of the redistribution structures in a direction of a thickness of the redistribution structures, and the base chip includes a second base chip on a first base chip, and
wherein the first and second base chips are between the side portions of the concave shape of the mold layer, the first landing pads are in contact with the at least two housing nodes, the second landing pads are electrically connected to the first base chip through connection balls, and the second base chip is electrically connected to the first landing pads through lead lines.

10. The semiconductor package structure of claim 5, further comprising:
an auxiliary housing chip under the housing chip, wherein the auxiliary housing chip is electrically connected to the redistribution structures through one of connection balls and lead lines, the connection balls and the lead lines contacting the auxiliary housing chip to the redistribution structures.

11. The semiconductor package structure of claim 5, wherein the housing chip includes a second housing chip on a first housing chip, the first housing chip being electrically connected to the second housing chip and the redistribution structures through through-silicon vias (TSVs) and bumps, the TSVs penetrating the first housing chip and contacting the bumps and the redistribution structures, and the bumps are on the TSVs and electrically connected to the second housing chip.

12. The semiconductor package structure of claim 5, wherein the housing chip includes a second housing chip on a first housing chip, the first housing chip being electrically connected to the second housing chip and the redistribution structures through through-silicon vias (TSVs) and lead lines, the TSVs penetrating the first housing chip and contacting the lead lines and the redistribution structures, and the lead lines extending from the TSVs toward the second housing chip and electrically connected to the second housing chip.

13. The semiconductor package structure of claim 5, wherein the redistribution structures are at least one of inside the mold layer and on a top surface of the mold layer.

14. The semiconductor package structure of claim 5, wherein the housing chip has a horizontal surface and a sidewall perpendicular to the horizontal surface to define a chip body in a vicinity of the redistribution structures,
wherein the housing chip has one shape selected from a group consisting of a corner configured to bring the horizontal surface into direct contact with the sidewall, an inclined surface between the horizontal surface and the sidewall, a stepped surface between the horizontal surface and the sidewall, and a concave in the horizontal surface, and
wherein the molding layer contacts at least one of:
the corner and the sidewall in the chip body; and
the horizontal surface, the sidewall, and the one selected shape.

* * * * *